United States Patent
Summerfelt et al.

(10) Patent No.: US 11,049,980 B2
(45) Date of Patent: Jun. 29, 2021

(54) INTEGRATED MIM DIODE

(71) Applicant: Texas Instruments Incorporated, Dallas, TX (US)

(72) Inventors: Scott Robert Summerfelt, Garland, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/668,004

(22) Filed: Oct. 30, 2019

(65) Prior Publication Data
US 2020/0168747 A1 May 28, 2020

Related U.S. Application Data

(60) Provisional application No. 62/752,454, filed on Oct. 30, 2018.

(51) Int. Cl.
*H01L 29/88* (2006.01)
*H01L 29/66* (2006.01)
*H01L 23/522* (2006.01)

(52) U.S. Cl.
CPC .......... *H01L 29/88* (2013.01); *H01L 23/5226* (2013.01); *H01L 29/66151* (2013.01)

(58) Field of Classification Search
CPC ............... H01L 29/88; H01L 29/66151; H01L 23/5226; H01L 27/0727; H01L 21/7687; H01L 29/6609; H01L 29/861
See application file for complete search history.

(56) References Cited

U.S. PATENT DOCUMENTS

| 10,074,639 | B2 | 9/2018 | Male et al. |
| 2018/0151463 | A1 | 5/2018 | Venugopal et al. |
| 2018/0151470 | A1 | 5/2018 | Cook et al. |
| 2018/0151487 | A1 | 5/2018 | Venugopal et al. |
| 2018/0190628 | A1 | 7/2018 | Male et al. |

(Continued)

FOREIGN PATENT DOCUMENTS

WO    WO-2013094169 A1 * 6/2013 ......... G11C 13/0069

OTHER PUBLICATIONS

Alimardani et al., "Investigation of the impact of insulator material on the performance of dissimilar electrode metal-insulator-metal diodes," Journal of Applied Physics 116, 024508 (2014), 12 pages.

(Continued)

*Primary Examiner* — Joseph C. Nicely
(74) *Attorney, Agent, or Firm* — Michael A. Davis, Jr.; Charles A. Brill; Frank D. Cimino

(57) ABSTRACT

In an integrated circuit, a metal-insulator-metal (MIM) diode includes: a first metallization structure level having a first metal layer; a first dielectric layer over the first metal layer; a metal contact or via on the first metal layer and extending through a portion of the first dielectric layer; and a second metallization structure level having a second metal layer; and a second dielectric layer over the second metal layer. The diode has a first electrode on the metal contact or via, a multilayer dielectric structure on the first electrode, and a second electrode between the multilayer dielectric structure and the second metal layer.

18 Claims, 18 Drawing Sheets

(56) References Cited

U.S. PATENT DOCUMENTS

2020/0075657 A1* 3/2020 Huang et al. ..... H01L 27/14629

OTHER PUBLICATIONS

Gadalla et al., "Design, Optimization and Fabrication of a 28.3 THz Nano-Rectenna for Infrared Detection and Rectification," Scientific Reports, Mar. 6, 2014, 9 pages.

Wikipedia contributors. "Ellingham diagram" Wikipedia, the Free Encyclopedia, http://en.wikipedia.org/wiki/Ellingham_diagram, Apr. 15, 2019. Web. Sep. 13, 2019, 3 pages.

Massachusetts Institute of Technology, "Ellingham Diagrams," http://web.mitedu/2.813/www/readings/Ellingham_diagrams.pdf, Downloaded on Sep. 13, 2019, 4 pages.

Grover et al., "Engineering the current-voltage characteristics of metal-insulator-metal diodes using double-insulator tunnel barriers," Solid-State Electronics 67 (2012), 6 pages.

Singh et al., "Fabrication and current-voltage characteristics of NiOx/ZnO based MIIM tunnel diode," Applied Surface Science, vol. 334, Apr. 15, 2015, pp. 197-204.

Devin A. Mourey, "Fast PEALD ZnO Thin-Film Transistor Circuits" IEEE Transactions on Electronic Devices, vol. 57, No. 2, Feb. 2010, pp. 530-534.

Aydinoglu F. et al., "Higher Performance Metal-Insulator-Metal Diodes using Multiple Insulator Layers," Austin Journal of Nanomedicine & Nanotechnology, Austin J Nanomed Nanotechnol—vol. 1 Issue 1—2014, 3 pages.

Youngeun Jeon et al., "Highly-Sensitive Thin Film THz Detector Based on Edge Metal-Semiconductor-Metal Junction," Scientific Reports, Dec. 4, 2017, 8 pages.

M. Alhazmi et al., "NSTOA-13-RA-108 Comparison of the Effects of Varying of Metal Electrode in Metal-Insulator-Metal Diodes with multi-dielectric layers," Austin Journal of Nanomedicine & Nanotechnology, Austin J Nanomed Nanotechnol—vol. 2 Issue 2—2014, 4 pages.

R.K. Grubbs et al., "Nucleation and growth during the atomic layer deposition of W on Al2O3 and Al2O3 on W" Thin Solid Films, vol. 467, Issues 1-2, Nov. 22, 2004, pp. 16-27.

G. Jayaswal et al., "Optical rectification through an Al2O3 based MIM passive rectenna at 28.3 THz" Materials today energy, vol. 7. Mar. 2018, pp. 1-9.

Zachary Thacker, "Terahertz Spectroscopy of Candidate Oxides in MIM Diodes for Terahertz Detection" IEEE Transactions on Terahertz Science and Technology, vol. 6, No. 3, May 2016, pp. 414-419.

Elif Gul Arsoy, Mesut Inac, Atia Shafique, Meric Ozcan, Yasar Gurbuz, "The metal-insulator-metal diodes for infrared anergy harvesting and detection applications," Proc. SPIE 9819, Infrared Technology and Applications XLII, 98190F (May 20, 2016); 6 pages.

Q. T. Vu et al., "Thermal oxidation of reactively sputtered amourphous W80N20 films," Journal of Applied Physics 68, 6420 (1990), 5 pages.

* cited by examiner

INTEGRATED MIM DIODE

CROSS-REFERENCE TO RELATED APPLICATION

Under 35 U.S.C. § 119, this application claims priority to, and the benefit of, U.S. provisional patent application No. 62/752,454, entitled "CMOS INTEGRATED THZ MIM DIODE", and filed on Oct. 30, 2018, the entirety of which is hereby incorporated by reference.

BACKGROUND

Semiconductor diodes often suffer from reduced performance at high frequencies in some applications, such as THz detectors (e.g., 10 µm IR detection), and diodes formed in silicon are generally not fast enough for such high frequency applications. Good high frequency semiconductor diodes use III-V materials, but these semiconductor types are not found in complementary metal oxide semiconductor (CMOS) wafers made from silicon or silicon-germanium materials. Metal insulator metal (MIM) diodes are tunnel diodes having near frequency independent properties, where the primary degradation is metal resistance to the diode. MIM Diodes are stand alone devices that can be mounted to a printed circuit board (PCB) and connected to CMOS circuitry of a separate integrated circuit (IC).

SUMMARY

An integrated circuit (IC) includes a semiconductor layer, a multilevel metallization structure over the semiconductor layer, and a diode in the multilevel metallization structure. A first metallization structure level has a first metal layer, a first dielectric layer over the first metal layer, and a metal contact or via on the first metal layer that extends through a portion of the first dielectric layer. A second metallization structure level has a second metal layer and a second dielectric layer disposed over the second metal layer. The diode has a first electrode on the metal contact or via, a multilayer dielectric structure on the first electrode, and a second electrode on the multilayer dielectric structure, where the second metal layer is disposed on the second electrode.

A diode includes a first electrode disposed on a metal contact or via in a first metallization structure level of a multilevel metallization structure. The diode has a multilayer dielectric structure disposed on the first electrode, and a second electrode having a first side and an opposite second side. The first side is disposed on the multilayer dielectric structure, and the side is disposed on a second metal layer in a second metallization structure level in the multilevel metallization structure.

In one example, the diode is integrated in an aluminum-based metallization structure, in which the first metal layer and the second metal layer are aluminum. In another example, the diode is integrated in a single or dual damascene copper-based metallization structure, in which the first metal layer and the second metal layer are copper. In one example, the first electrode is a metal layer having a work function greater than 5. In one example, the metal contact or via is a tungsten layer disposed on the first metal layer, and the first electrode is tungsten nitride. In one example, the second electrode is a metal layer having a work function less than 5. In one example, a first layer and a last layer of the multilayer dielectric structure are one of aluminum oxide, zirconium dioxide, silicon dioxide, hafnium dioxide, and tantalum oxide. In one example, the multilayer dielectric structure has an odd number, odd numbered layers are one of aluminum oxide, zirconium dioxide, silicon dioxide, hafnium dioxide, and tantalum oxide, and even numbered layers are one of titanium oxide, nickel oxide, cobalt oxide, tungsten oxide, copper oxide, and germanium oxide.

A method of fabricating a multilevel metallization structure includes forming a metal contact or via on a first metal layer and through a portion of a first dielectric layer in a first metallization structure level and forming a first electrode on the metal contact or via. The method also includes forming a multilayer dielectric structure on the first electrode and forming a second electrode on the multilayer dielectric structure, and forming a second metal layer in a second metallization structure level in the multilevel metallization structure. In one example, the first electrode is formed by performing a plasma nitridation process that nitrides a portion of the metal contact or via to form the first electrode on the metal contact or via. In one example, the multilayer dielectric structure is formed by performing an odd integer number N atomic layer deposition processes that successively deposit N respective dielectric layers over the first electrode.

DETAILED DESCRIPTION

Figure 1:
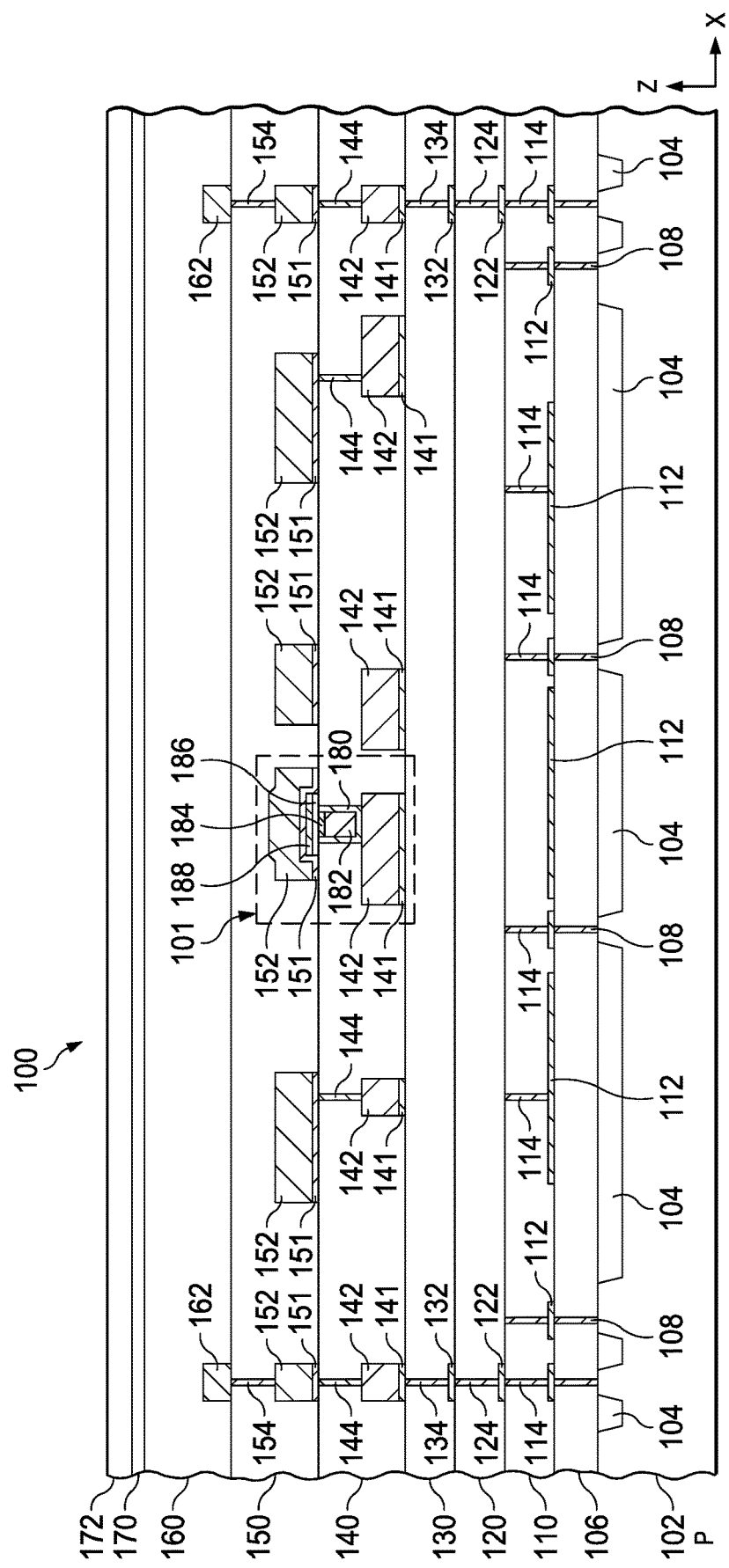
FIG. 1 is a partial sectional side elevation view of an integrated circuit with an integrated diode according to one embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
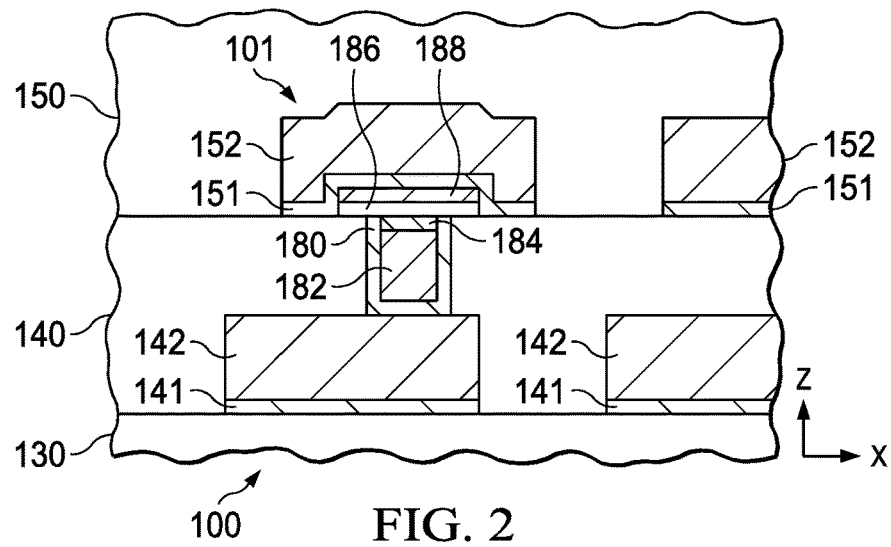
FIG. 2 is a partial sectional side elevation view showing further details of the diode of FIG. 1.

FIGS. 1 and 2 show an integrated circuit 100 with a MIM diode 101 in a multilevel metallization structure of the IC 100. The IC 100 includes a p-type semiconductor layer 102 having isolation structures 104 (e.g., shallow trench isolation or STI structures) formed on or in a top side of the semiconductor layer 102, and a multilevel metallization structure disposed over the top side of the semiconductor layer 102. The semiconductor layer in one example is a silicon layer, a silicon-germanium layer, a silicon-on-insulator (SOI) structure, or another layer having semiconductor material. The IC 100 includes multiple electronic components, for example, transistors, resistors, capacitors (not shown) formed on and/or in the semiconductor layer 102, as well as the MIM diode 101 disposed in the multilevel metallization structure above the semiconductor layer 102. The IC 100 includes a first dielectric layer 106, referred to herein as a pre-metal dielectric (PMD) layer, such as silicon dioxide ($SiO_2$) or other suitable dielectric material. Conductive metal contacts 108 (e.g., tungsten (W)) extend through the PMD layer 106 to form electric connections with features of circuit components formed on and/or in the semiconductor layer 102.

An inter-layer or inter-level dielectric layer (ILD) 110 is disposed over the PMD layer 106. In one example, the ILD 110 is or includes silicon dioxide. One or more aluminum metal lines 112 extend along select portions of a top side of the PMD layer 106 to provide signal routing within the ILD 110 and electrical connection to select ones of the underlying contacts 108. Conductive metal vias 114 extend from respective ones of the metal lines 112 through the ILD 110 between the associated metal line 112 and the top side of the ILD 110. The multilevel metallization structure has a next metallization structure level that includes an ILD layer 120 disposed over the top side of the preceding ILD 110, along with respective aluminum metal lines 122 and vias 124. A further metallization structure level includes an ILD 130, aluminum metal lines 132, and vias 134.

The IC 100 of FIGS. 1 and 2 also includes a next metallization structure level above the ILD 130, referred to herein as a first metallization structure level. In the illustrated example, the first ILD level is spaced from the PMD level by intervening metallization structure levels, although not a strict requirement of all possible implementations. The first metallization structure level includes a first dielectric layer (ILD) 140, as well as a first metal layer 141, 142 and a first via 144. In one example, the metal lines of the various levels of the multilevel metallization structure, including the first metal layer 141, 142 are multilayer structures, although not a requirement of all possible implementations. The example first layer has a metal titanium layer 141 (Ti) that is or includes titanium, and a titanium nitride layer (TiN) that is or includes titanium nitride. In addition, the first metal layer 141, 142 includes a thicker metal layer 142 that is or includes aluminum in one example. The example first metallization structure level is disposed over the preceding metallization structure level (e.g., over the ILD 130 and associated vias 134), and includes metal vias 144. The first dielectric layer 140 is disposed over the first metal layer 141, 142 and extends from the top side of the underlying ILD dielectric layer 130 upward to the bottom of a subsequent (e.g., second) metallization structure level. Vias 144 in one example are tungsten. In another implementation, the vias 144 are or include a different conductive metal. The vias 144 extend from a top portion of the associated first metal layer 141, 142 through a portion of the first dielectric layer 140 to electrically connect the associated first metal layer 141, 142 with the second metallization structure layer.

The IC 100 also includes a second metallization structure level over the first metallization structure level in the multilevel metallization structure. The second metallization structure level in this example includes a second dielectric layer 150 (e.g., ILD), as well as a second metal layer 151, 152. The second dielectric layer 150 is disposed over the second metal layer 151, 152. The illustrated example has a first layer 151 having a metal titanium layer (e.g., Ti) that is or includes titanium, and a titanium nitride layer (e.g., TiN) that is or includes titanium nitride. In addition, the second metal layer 151, 152 includes a thicker metal layer 152 that is or includes aluminum. The second metallization structure level is disposed over the ILD 140 and associated vias 144 of the preceding first metallization structure level. The second metallization structure level has metal vias 154. The first dielectric layer 150 is disposed over the second metal layer 151, 152 and extends from the top side of the underlying ILD 140 upward to the bottom of an overlying ILD 160 of a subsequent metallization structure level. The uppermost (e.g., final) metallization structure level in one example includes aluminum or other metal lines 162. The IC 100 includes one or more capping layers 170 and 172 over a top side of the uppermost ILD 160. The vias 154 of the second level are tungsten in one example. In another implementation, the vias 154 are or include a different conductive metal. The vias 154 extend from a top portion of the associated second metal layer 151, 152 through a portion of the second dielectric layer 150 to electrically connect the associated second metal layer 151, 152 with the next overlying metallization structure layer, if any.

Referring to FIG. 2, the diode 101 is a MIM diode integrated into the first and second levels of the multilevel metallization structure. In other implementations, the diode 101 is integrated into any two adjacent levels of the multilevel metallization structure of the IC 100. One terminal (e.g., bottom electrode) of the MIM diode 101 is or includes a high work function metal (e.g., work function greater than 5), and the second diode terminal (e.g., upper electrode) is or includes a low work function metal (e.g., work function less than 5) connected to an associated first metal layer, in this example, a Ti/Tin layer 141 and a connected aluminum metal line 142 in the first dielectric layer 140. A diode terminal via has a titanium/titanium nitride (Ti/TiN) layer 180 that extends on sidewalls and a bottom of a tungsten (W) via 182. The tungsten via 182 and the surrounding Ti/TiN layer 180 form a metal via. In other implementations where the diode 101 is integrated into a first level of a multilevel metallization structure, the lower diode electrode or terminal is disposed on a metal contact (e.g., a PMD layer contact 108). In other examples, a different view or contact material can be used, such as aluminum or copper, and a lower MIM diode electrode is deposited on a top portion of the via or contact.

The diode 101 includes a first electrode 184 disposed on the metal via 180, 182. In one example, the first electrode 184 is a metal layer having a work function greater than 5. In the example of FIG. 1, the metal via 180, 182 is or includes a tungsten layer 182 disposed directly or indirectly on the first metal layer 141, 142. In the example of FIGS. 1 and 2, the tungsten via 182 is disposed indirectly on the aluminum first metal layer 142 through the Ti/TiN layer 180. The first electrode 184 is tungsten nitride (e.g., WyNx, such as $W_2N$), which has a higher work-function than tungsten and slower oxidation. In one example, the first electrode 184 is directly on a top of the tungsten layer 182. For example, the electrode 184 is formed by nitridation of an upper surface of the tungsten via 182 to form tungsten nitride. In other implementations, a different high work function metal is used, which can be formed by chemical processing or by separate deposition. In one example, the electrode 184 is or includes platinum (e.g., Pt). In another example, the electrode 184 is or includes iridium (e.g., Jr). In another example, the electrode 184 is or includes rhodium (e.g., Rh). In another example, the electrode 184 is or includes ruthenium (e.g., Ru). A small underlying contact or via helps diode performance. In one example, the via 182, 184 is or includes a low work function metal material. In another example, the via 182, 184 is or includes a high work function metal material. Very high work function metals for the first electrode 184, such as Pt and Jr are expensive and difficult to process. Tungsten has a moderately high work function (e.g., 4.6) tungsten nitride as a higher work function (e.g., 5.12 (that is close to the work function for Jr (e.g., 5.27).

The diode 101 also has a multilayer dielectric structure 186 disposed on the first electrode 184, and a low work function metal second electrode 188 disposed on the multilayer dielectric structure 186 in the second metallization structure level. In one example, the second metal layer 151, 152 is disposed on the second electrode 188. The multilayer dielectric structure 186 has an integer number N layers, where N is greater than 1. In one example, a first (e.g., bottom) layer and a last (e.g., uppermost) layer of the multilayer dielectric structure 186 are any one or more of aluminum oxide (e.g., $Al_2O_3$), zirconium dioxide (e.g., $ZrO_2$), silicon dioxide (e.g., $SiO_2$), hafnium dioxide (e.g., $HfO_2$), or tantalum oxide (e.g., $Ta_2O_5$). In the example of FIGS. 1 and 2, the first and last layers of the multilayer dielectric structure 186 are aluminum oxide (e.g., $Al_2O_3$). In one example, the multilayer dielectric structure 186 has an odd number of dielectric layers (e.g., N is an odd integer greater than 2). In one implementation, the individual odd numbered layers of the multilayer dielectric structure 186 are one of aluminum oxide, zirconium dioxide, silicon dioxide, hafnium dioxide, and tantalum oxide (e.g., $Ta_2O_5$), and the individual even numbered layers of the multilayer dielectric structure 186 are one of titanium oxide (e.g., $TiO_2$) nickel oxide (e.g., NiO), cobalt oxide (e.g., $Co_2O_3$), tungsten oxide (e.g., $WO_3$), copper oxide (e.g., $Cu_2O$), and germanium oxide (e.g., $GeO_2$).

The low work function metal second electrode 188 is disposed on the multilayer dielectric structure 186. In one example, the second metal layer 151, 152 includes titanium nitride portions 151 and aluminum portions 152 as described above, and the second electrode 188 in FIGS. 1 and 2 is or includes a metal layer having a work function less than 5. In one example, the second electrode 188 is or includes titanium (e.g., Ti). In another example, the second electrode 188 is or includes scandium (e.g., Sc). In another example, the second electrode 188 is or includes strontium (e.g., Sr). In another example, the second electrode 188 is or includes lithium (e.g., Li). In another example, the second electrode 188 is or includes potassium (e.g., K). In another example, the second electrode 188 is or includes hafnium (e.g., Hf).

High performance of the integrated MIM diode 101 is facilitated by a small area, large metal electrode work function difference, in combination with multi-layer dielectric structure 186 with thickness control at the atomic level with different bandgaps, and some of which having lower bandgaps, integrated into CMOS technology between low resistance metal layers with minimal added process cost. The CMOS integration facilitates close coupling of THz devices. The MIM diode integration helps THz detectors compared to current approach of heat generation. The MIM diode in certain applications facilitates converting lower frequency signals to higher frequencies, where THz operation is too fast for current semiconductor diodes, and the integrated MIM diode 101 has little frequency degradation due to quantum tunneling current.

Figure 3:
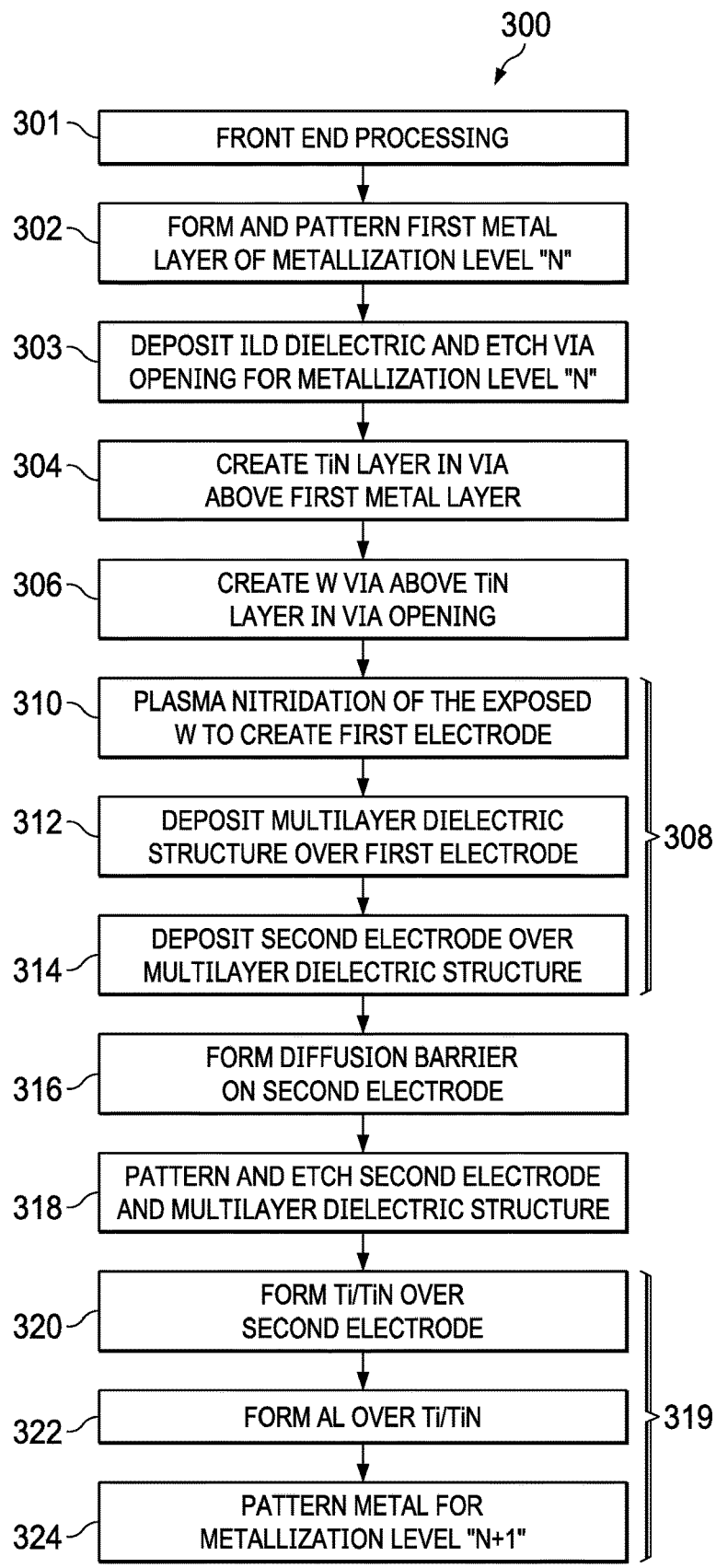
FIG. 3 is a flow diagram of a method of fabricating a metallization structure with an integrated diode according to another embodiment.

FIG. 3 shows a method 300 of fabricating an integrated circuit including a multilevel metallization structure. FIGS. 4-14 show partial views of the diode 101 in the IC 100 of FIGS. 1 and 2 undergoing fabrication processing according to the method 300. The method 300 shows acts and events associated with construction of a multilevel metallization structure that incorporates the MIM diode 101, and these steps may concurrently be used for fabricating interconnection of other electronic circuits and/or components (e.g., transistor circuits, etc., not shown) in a single IC 100. The metallization structure in one example includes metal lines and vias that electrically couple terminals of the MIM diode 101 to one or more internal components (not shown).

The method 300 includes front end processing at 301, for example, fabricating one or more circuit components on and/or in a starting wafer. The fabrication further includes forming a pre-metal dielectric layer and associated contacts (e.g., tungsten) that are electrically coupled with one or more electronic circuit components of the IC 100. Thereafter, a multilevel metallization structure is fabricated level by level. In the example of FIG. 1, the diode 101 is constructed in first and second levels that respectively include interlayer dielectric layers 140 and 150.

Figure 4:
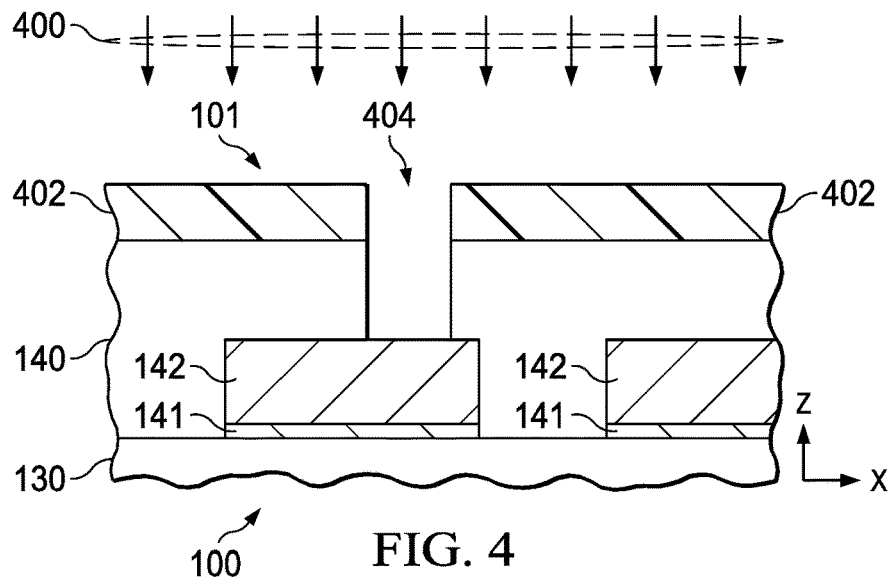
FIGS. 4-14 are partial sectional side elevation views of the integrated circuit of FIGS. 1 and 2 undergoing fabrication processing according to the method of FIG. 3.

The method 300 of FIG. 3 continues at 302, where a first metal layer of metallization level "N" is formed and patterned. FIG. 4 shows portions of a patterned first metal layer that has a titanium layer 141. In another example, the layer 141 includes a multilayer structure with a lower titanium sublayer formed on a top side of the ILD 130 of the preceding metallization structure level, and an overlying titanium nitride sublayer. The first metal layer in FIG. 4 also includes a thicker aluminum metal layer 142 that overlies the Ti or Ti/TiN layer 141. The first metal layer 141, 142 is patterned to provide a feature 141, 142 that will be electrically connected to a bottom electrode of the subsequently formed diode 101, as well as a portion of another feature partially shown in FIG. 4. The method 300 continues with depositing the ILD dielectric for metallization structure level "N" and etching of the opening in the deposited ILD dielectric. In the example of FIG. 4, the ILD dielectric layer 140 (e.g., silicon dioxide) extends over the patterned first metal layer 141, 142, and an etch process 400 is performed using an etch mask 402. The etch process 400 etches a portion of the ILD layer 140 to form the opening 404. The opening 404 exposes a portion of an upper side of the aluminum 142 of the first metal layer.

Figure 5:
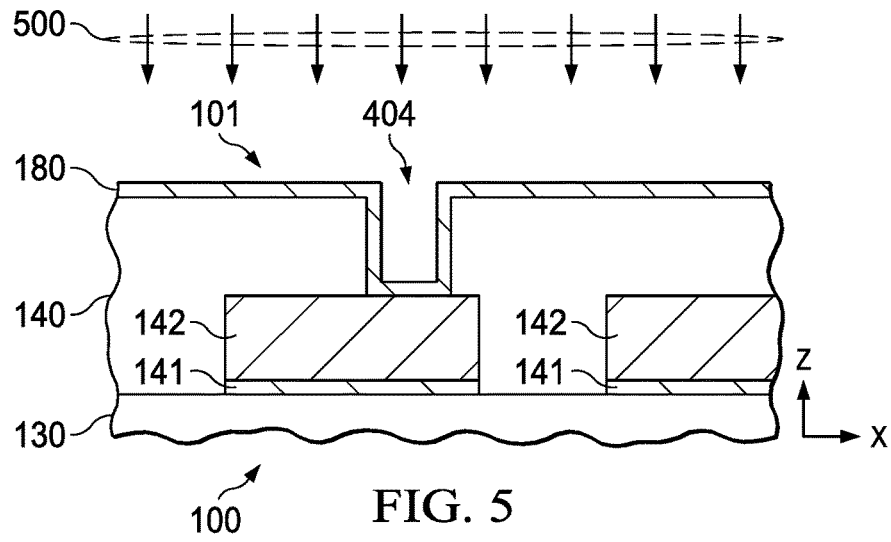
Figure 6:
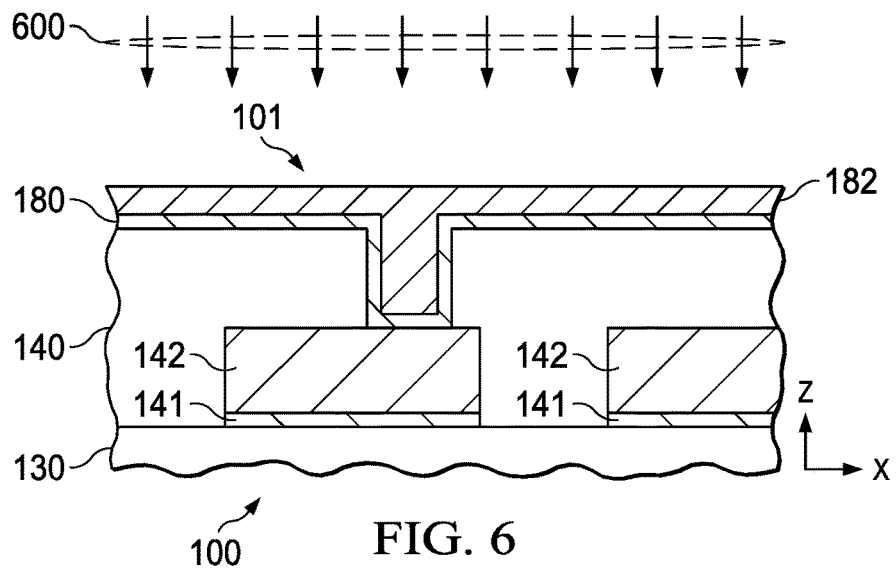

The method 300 continues with formation of a via on the first metal layer at 304 and 306. A titanium nitride layer is formed at 304 in the attached opening of the ILD. FIG. 5 shows one example, in which a deposition process 500 is performed that deposits a titanium layer, or a titanium nitride layer, or a titanium/titanium nitride multilayer 180 in the opening 404. At 306 in FIG. 3, a conductive metal via is formed above the layer 180 in the opening. FIG. 6 shows one example, in which a deposition process 600 is performed that deposits tungsten over the layer 180 in the opening. The wafer is planarized, for example, using chemical mechanical polishing (CMP) processing to remove excess portions of the layers 180 and 182 along the top side of the wafer, exposing the top side of the ILD 140. The processing at 303, 304 and 306 forms the metal via 180, 182 on the first metal layer 141, 142 and through a portion of a first dielectric layer 140 in the first metallization structure level.

Figure 7:
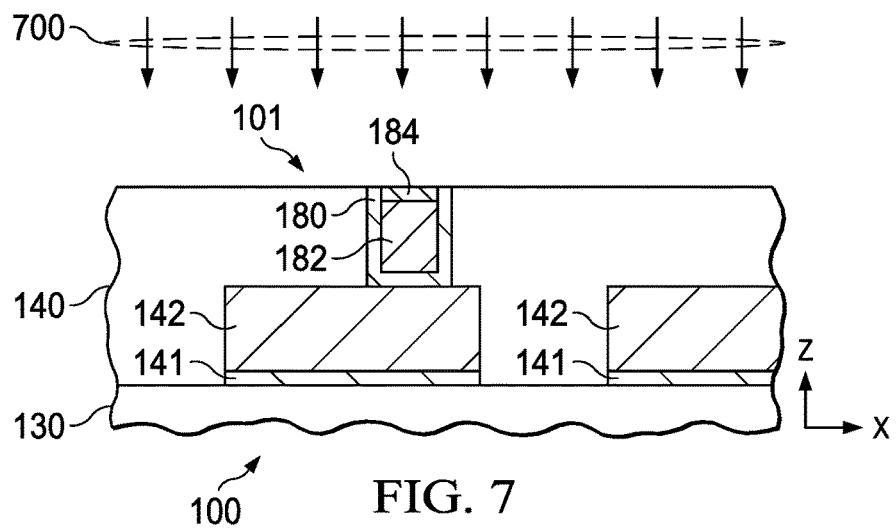

The method 300 continues with formation of a MIM diode at 308. The processing at 308 in this example provides an included method for integrating a MIM diode into a multilevel metallization structure of an IC. At 310, a first electrode is a formed (e.g., a bottom electrode). FIG. 7 shows one example, in which a plasma nitridation process 700 is performed. The nitridation process 700 converts an upper portion of the deposited tungsten via 182 into tungsten nitride to form the first electrode 184 on the metal via 180, 182. The plasma nitridation process 700 nitrides a portion of the metal contact or via 180, 182 to form the first electrode 184 on the metal contact or via 180, 182. In one example, the nitridation process 700 is a high energy plasma process using $N_2$ or $NH_3$ at 300-450 C with a bias voltage applied to the wafer to convert the surface layer of tungsten (W) to WyNx, which has a higher work function than tungsten and slower oxidation than tungsten. In one example, the plasma nitridation process 700 is performed on tungsten at a temperature of 300-450 C (e.g., 400 C) to form the tungsten nitride first electrode 184 having a thickness of approximately 2-5 nm.

Figure 8:
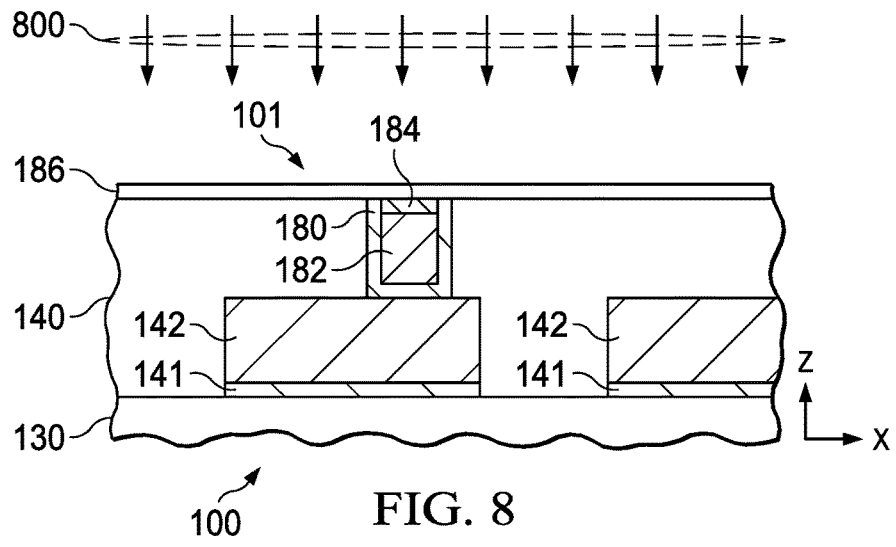

At 312, the insulator portion of the MIM diode 101 is formed as a multilayer dielectric structure on the first electrode 184. FIG. 8 shows one example, in which a deposition process 800 is performed that deposits the multilayer dielectric structure 186 over the first electrode 184. In one example, the deposition process 800 is a series of multiple atomic layer deposition (ALD) processes that successively deposit an integer number N individual layers of the multilayer dielectric structure 186, where N is greater than 2. In one example, the processing 800 includes an odd number N ALD processes. In one example, the first ALD process deposits aluminum oxide (e.g., $Al_2O_3$) on the first electrode 184, and a last or $N^{th}$ ALD processes deposits aluminum oxide (e.g., $Al_2O_3$) on dielectric layer N-1. In another example the first (e.g., bottom) layer and the last (e.g., uppermost) layer of the multilayer dielectric structure 186 are any one or more of aluminum oxide (e.g., $Al_2O_3$), zirconium dioxide (e.g., $ZrO_2$), silicon dioxide (e.g., $SiO_2$), hafnium dioxide (e.g., $HfO_2$), tantalum oxide (e.g., $Ta_2O_5$), or titanium oxide (e.g., $TiO_2$). In one example, the first one of the atomic layer deposition processes 800 is performed in a mildly oxidative environment.

In one example, the multi-pass ALD processing 800 deposits an odd number N dielectric layers, in which individual odd numbered ALD steps form corresponding odd numbered layers of the multilayer dielectric structure 186 by depositing one of aluminum oxide, zirconium dioxide, silicon dioxide, hafnium dioxide, and tantalum oxide (e.g., $Ta_2O_5$). In certain examples, the atomic layer deposition of the high bandgap material oxygen stable layer on WN or W is performed using reactants such as ($H_2O$+($N_2O$ and/or NO and/or $NH_3$ and/or $H_2$ and/or CO)) or (($N_2O$ and/or NO)) with initial exposure of ($NH_3$ and/or $H_2$ and/or CO). The ALD is done at moderate temperatures approximately 250-400 degrees C. The mild reactants ideally contain nitrogen to help keep WN stable. The reactants still contain oxygen to create the necessary high band gap oxides but in combination with a reductant gas. The use of mild reactants mitigates or prevents oxidation of the WN layer while allowing the high band gap dielectric to be formed. The ratio of the reactant gasses are adjusted to allow formation of the high band gap oxide dielectric while keeping the WN stable. The individual even numbered ALD steps in this example form corresponding even numbered layers of the multilayer dielectric structure 186 by depositing a low bandgap material, such as one of titanium oxide (e.g., $TiO_2$) nickel oxide (e.g., NiO), cobalt oxide (e.g., $Co_2O_3$), tungsten oxide (e.g., $WO_3$), copper oxide (e.g., $Cu_2O$), and germanium oxide (e.g., $GeO_2$).

In one example, all the layers of the multilayer dielectric structure 186 are thin to facilitate operation as a tunnel dielectric of the MIM diode 101. In addition, the first and last layers of the multilayer dielectric structure 186 are preferably made of an oxygen stable material, such as aluminum oxide. Other suitable materials for the first and last layers of the multilayer dielectric structure 186 include $ZrO_2$, $SiO_2$, $HfO_2$, $Ta_2O_5$, and $TiO_2$. Aluminum oxide implementations may include oxidizing aluminum from a deposited precursor like $AlCl_2$ or tri-methyl Al. Other suitable materials for the first layer of the multilayer dielectric structure 186 include dielectric nitrides, such as silicon nitride or aluminum nitride (e.g., SiN or AN). Additional dielectric materials in the multilayer dielectric structure 186 can include lowered bandgap materials, such as NiO, $Co_2O_3$, $WO_3$, $Cu_2O$, $GeO_2$, and/or $TiO_2$. In certain examples, the adjacent layers of the multilayer dielectric structure 186 alternate between two different dielectrics. One suitable implementation has an odd number of layers. One example 5-layer dielectric structure 186 includes successive layers having $AlO/Cu_2O/AlO/Cu_2O/AlO$. Another example 5-layer dielectric structure 186 includes successive layers having $SiO_2/TiO_2/SiO_2/TiO_2/SiO_2$. Another example 5-layer dielectric structure 186 includes successive layers having $Al_2O_3/Cu_2O/Al_2O_3/Cu_2O/Al_2O_3$.

In one example, the initial dielectric layer formed on a tungsten contact or via (e.g., via 182) is deposited in a mildly oxidative environment. In one example, the multilayer dielectric structure 186 is fabricated using atomic layer deposition of AlO, $SiO_2$ in $H_2O$ at a low temperature. In another example, the multilayer dielectric structure 186 is fabricated using atomic layer deposition of AlO or other high oxygen stability layer with a mild oxidizer such as $H_2O$, $CO_2$, $N_2O$, NO, including initial growth with a small concentration of reducers like CO, $H_2$ or even $NH_3$ in one example.

For examples using a tungsten via 182 and a tungsten nitride lower electrode 184, the atomic layer deposition of the first layer of the multilayer dielectric structure 186 in one example does not use $O_3$. In one example, this initial ALD deposition is a low temperature deposition process with $H_2O$. Although WN oxidizes with $H_2O$ but controlled low temperature atomic layer deposition is used to mitigate tungsten nitride oxidation in one example, for example, with a mild oxidizer. Example mild oxidizers include $H_2O$, $CO_2$, $N_2O$, and NO. In one example, the initial atomic layer deposition is performed with a small concentration of reducers, such as $NH_3$, $H_2$ or CO. Higher bandgap tunnel dielectric layers of the multilayer dielectric structure 186 are preferably formed as thinner layers in one example. In one implementation, following protection of the tungsten nitride electrode 184 with an initial AlOx or other suitable first layer, subsequent layers of the multilayer dielectric structure 186 are deposited using higher temperature and/or stronger oxidizers, such as $O_3$ or $H_2O+O_2$ or plasma $O_2$. In particular, many low bandgap dielectric layers like NiO, $Cu_2O$ benefit from deposition using strong oxidizers. Low bandgap oxides that use materials already found in many wafer fabrication facilities include $TiO_2$, NiO, $Co_2O_3$, $WO_3$, $Cu_2O$, $GeO_2$. In certain examples, the dielectric material and composition can be tailored or optimized with electrode materials to maximize diode asymmetry to facilitate diode performance at high frequencies such as THz.

Figure 9:
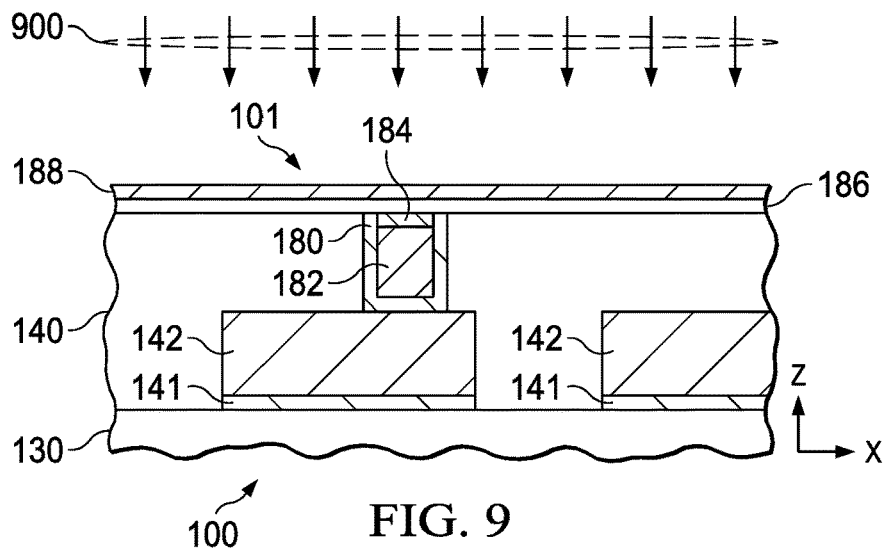
Figure 10:
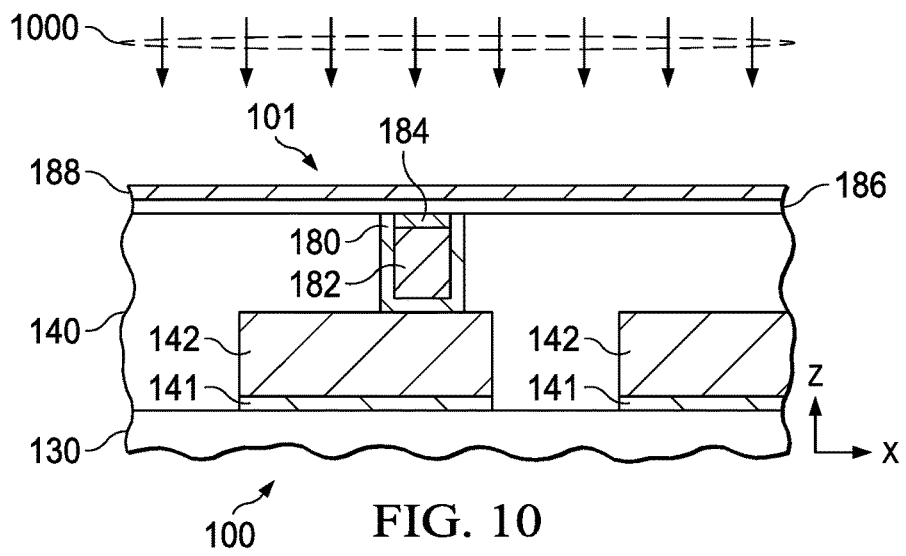

At 314, the method 300 continues with forming a second electrode on the multilayer dielectric structure. FIG. 9 shows one example, in which a plasma vapor deposition (PVD) process 900 is performed that deposits the second electrode layer 188 on the uppermost layer of the multilayer dielectric structure 186. In one example, the upper or second electrode 188 is a low work function metal, for example, having a work function less than 5, such as titanium form to a thickness of approximately 20 nm. In one example, the deposition process 900 forms the second electrode 188 by depositing titanium, or titanium nitride, or depositing titanium followed by deposition of titanium nitride. In another example, the deposition process 900 forms the second electrode 188 by depositing scandium. In another example, the deposition process 900 forms the second electrode 188 by depositing strontium. In another example, the deposition process 900 forms the second electrode 188 by depositing lithium. In another example, the deposition process 900 forms the second electrode 188 by depositing potassium. In another example, the deposition process 900 forms the second electrode 188 by depositing hafnium. In one example, the low work function second electrode layer 188 is capped with a diffusion barrier layer at 316 in FIG. 3. FIG. 10 shows one example, in which a deposition process 1000 is performed that deposits a diffusion layer (not shown) on the second electrode 188.

Figure 11:
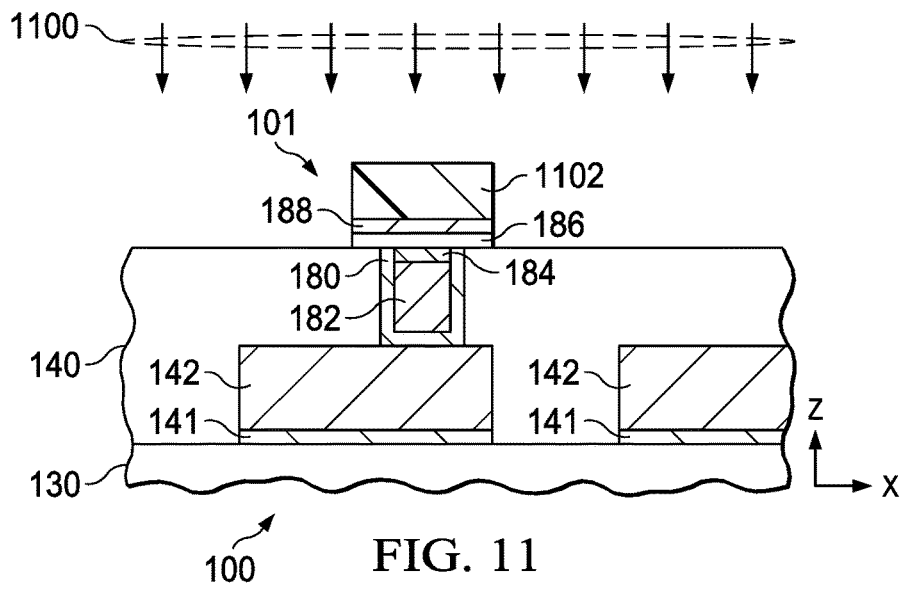

At 318, the second electrode and multilayer dielectric structure are patterned and etched. FIG. 11 shows one example, in which an etch process 1100 is performed using an etch mask 1102. The etch process 1100 removes exposed portions of the second electrode layer 188 (and any included diffusion barrier layer, not shown), as well as subsequently exposed portions of the multilayer dielectric structure 186. In one example, the etch process 1100 has multiple etch steps to selectively remove the layers 188 and 186, using a single mask 1102 or multiple masks.

Figure 12:
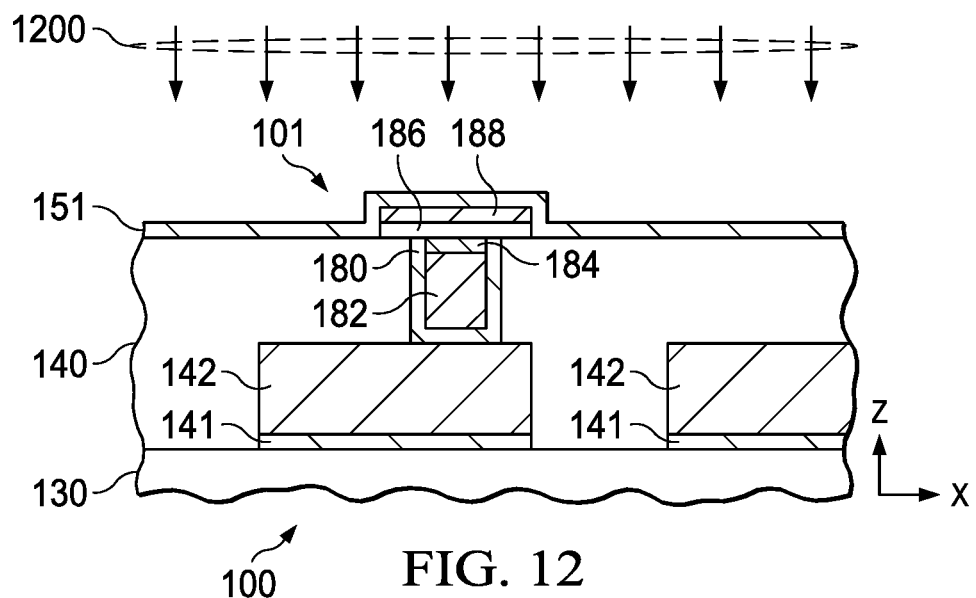
Figure 13:
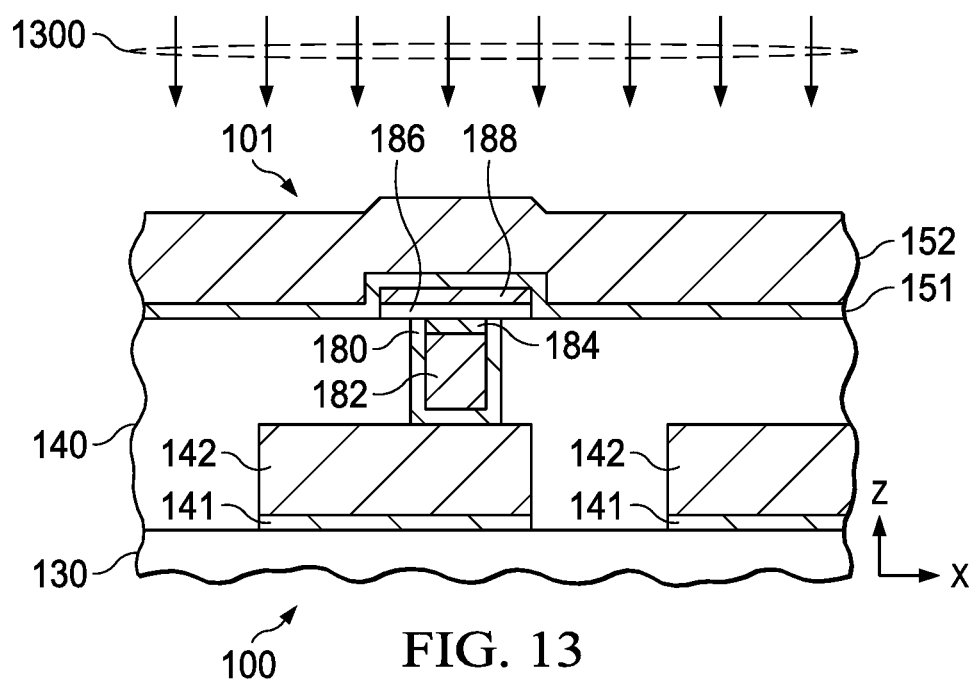
Figure 14:
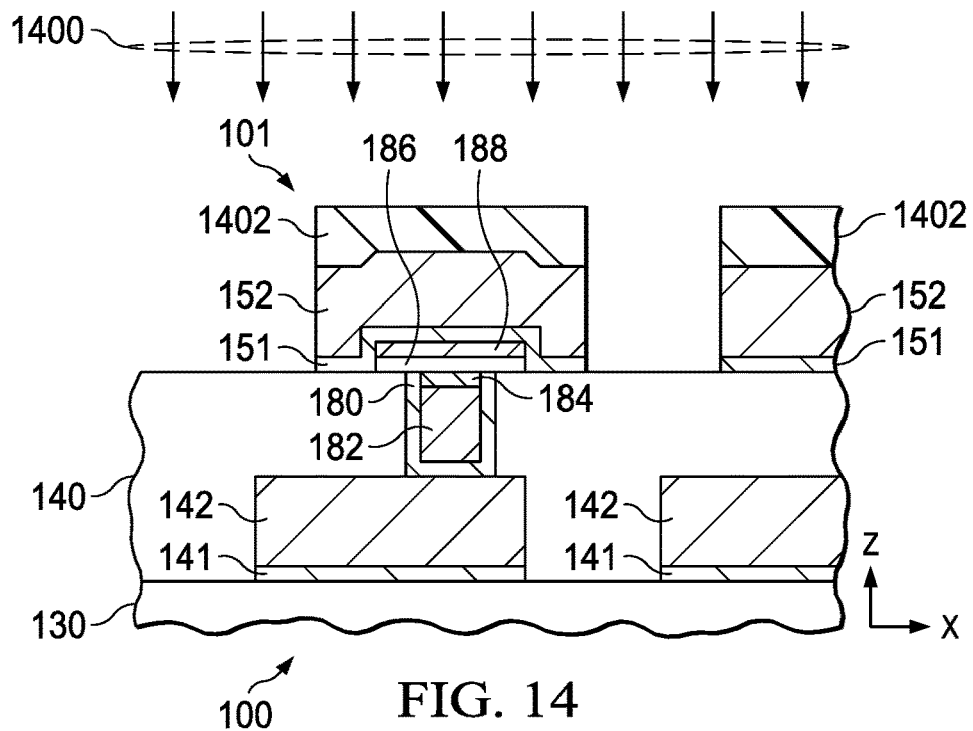
Figure 15:
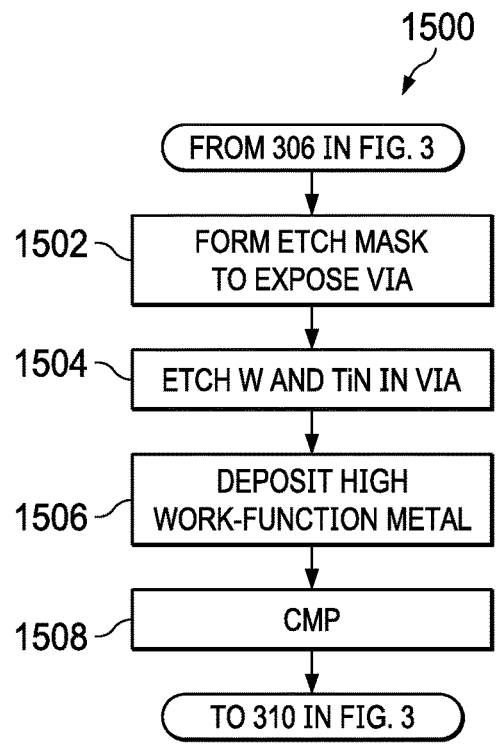
FIG. 15 is a flow diagram of an alternate process to form the first electrode in the integrated circuit of FIGS. 1 and 2.

The method 300 in FIG. 3 continues at 319 to form metal lines of the next (e.g., second) metallization structure level. The processing at 319 in FIG. 3 forms the second metal layer 151, 152 in the second metallization structure level in the IC 100 of FIGS. 1 and 2 to electrically couple the second metallization structure level to the second electrode 186. At 320, a titanium layer, or a titanium nitride layer, or a titanium/titanium nitride multilayer is formed over the second electrode 188. FIG. 12 shows one example, in which a deposition process 1200 is performed that deposits a titanium/titanium nitride multilayer 151 in the second multilayer metallization structure level over the second electrode 188. At 322, aluminum is formed over the titanium/titanium nitride multilayer 151. FIG. 13 shows one example, in which a deposition process 1300 is performed that deposits aluminum 152 over the second electrode 188. At 324, the deposited layers 151 and 152 of the second metal layer are patterned, along with other metal line structures of the second metallization structure level in parentheses e.g., level N+1 in FIG. 3. FIG. 14 shows one example, in which an etch process 1400 is performed with an etch mask 1402 that removes exposed portions of the layers 151 and 152. Thereafter, the mask 1402 is removed and the IC fabrication process continues with deposition of the next ILD layer (e.g., layer 150 in FIGS. 1 and 2 above), followed by completion of the multilevel metallization structure, wafer probe testing, die singulation, packaging, and final testing (not shown).

Figure 16:
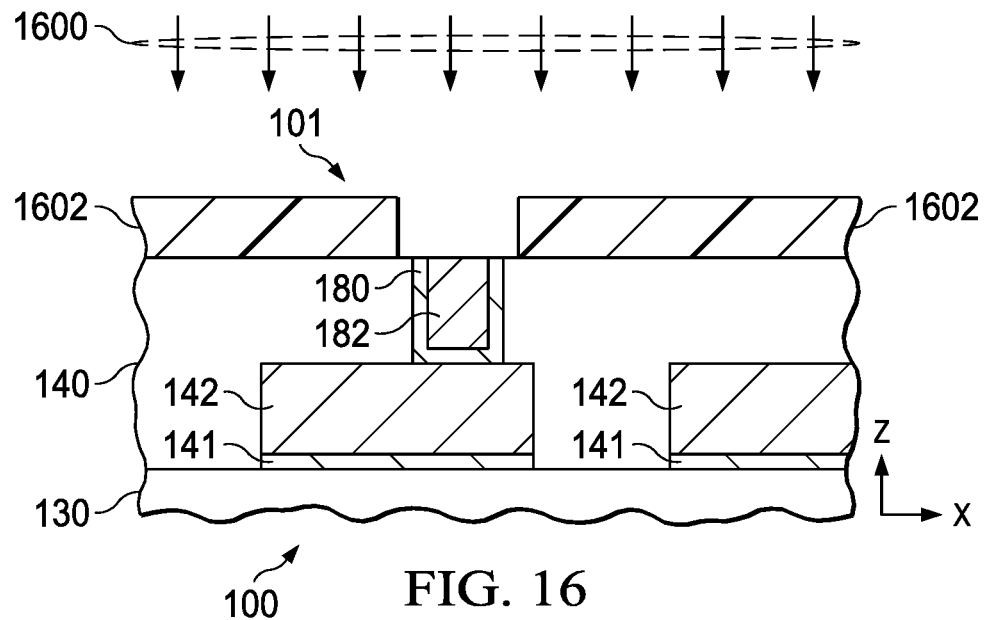
FIGS. 16-19 are partial sectional side elevation views of the integrated circuit of FIGS. 1 and 2 undergoing fabrication processing according to the alternate process of FIG. 15.
Figure 17:
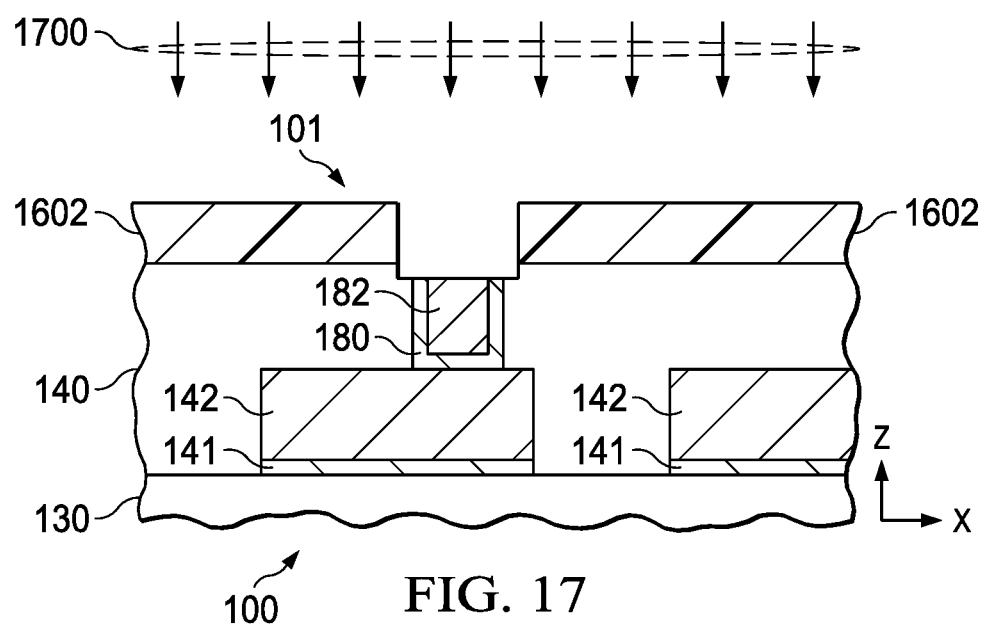
Figure 18:
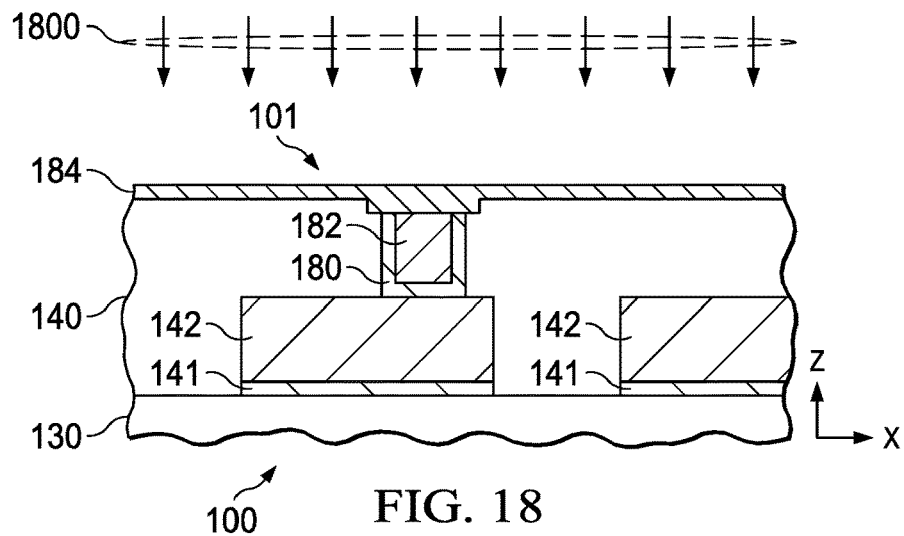
Figure 19:
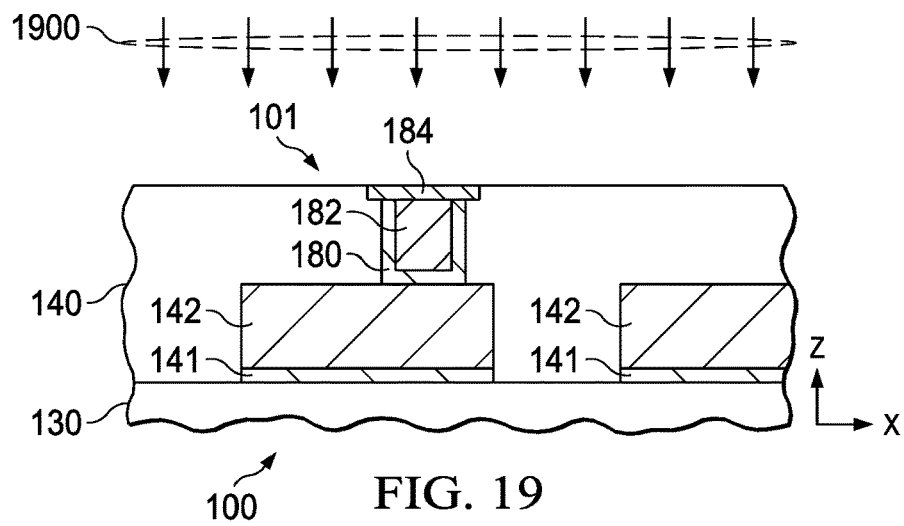

Referring now to FIGS. 15-19, FIG. 15 shows an alternate process 1500 to form the first electrode 184 through deposition processing in the integrated circuit of FIGS. 1 and 2, and FIGS. 16-19 show the diode 101 undergoing fabrication processing according to the alternate process 1500. The process 1500 deposits a high work function metal to form the first electrode 184 of the MIM diode 101. In one example, the process 1500 starts after the via creation at 306 in FIG. 3 above and includes forming an etch mask to expose the via at 1502. FIG. 16 shows one example, in which a process 1600 forms an etch mask 1602 with an opening that exposes an upper portion of the tungsten via 182 and the titanium/titanium nitride layer 180. At 1504 in FIG. 15, the via 182 is etched, either alone or along with any exposed portion of the titanium/titanium nitride 180. FIG. 7 shows one example, in which a wet or dry etch process 1700 is performed using the etch mask 1602. The etch process 1700 in this example etches an upper portion of the exposed tungsten via 182 and the titanium/titanium nitride layer 180. At 1506 in FIG. 15, the alternate electrode formation process 1500 includes depositing a high work function metal. FIG. 18 shows one example, in which a deposition process 1800 deposits a high work function metal 184 above the tungsten via 182 and the titanium/titanium nitride layer 180. In one example, the process 1800 deposits platinum 184. In another example, the process 1800 deposits iridium 184. In another example, the process 1800 deposits rhodium 184. The processed wafer is done planarized at 1508 using chemical mechanical polishing to leave the first electrode 184 over the via 182 and finish the alternate electrode fabrication processing 1500. FIG. 19 shows one example, in which a CMP process 1900 is performed that planarizes the top side of the wafer. The integrated circuit fabrication then continues at 310 in FIG. 3 as described above.

Figure 21:
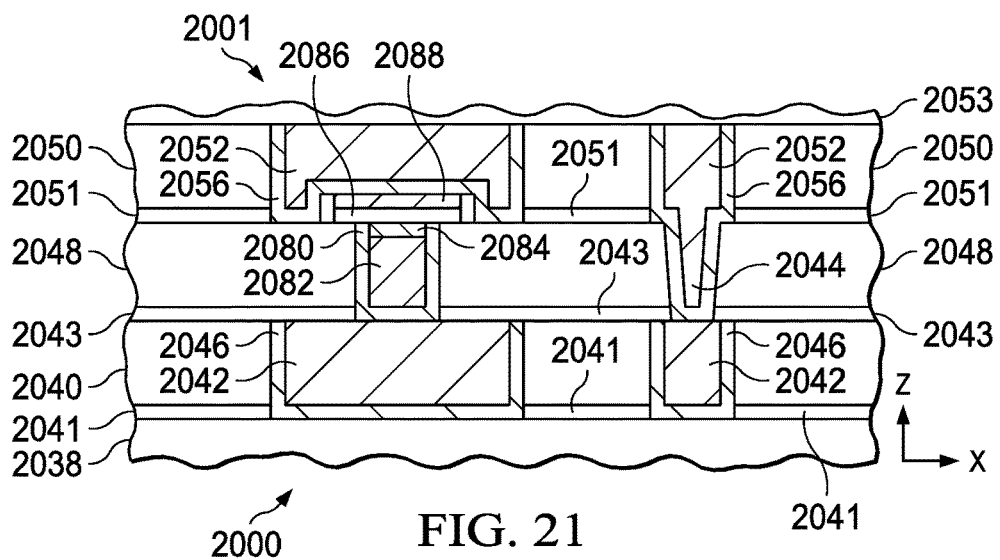
FIG. 21 is a partial sectional side elevation view showing further details of the diode of FIG. 20.
Figure 20:
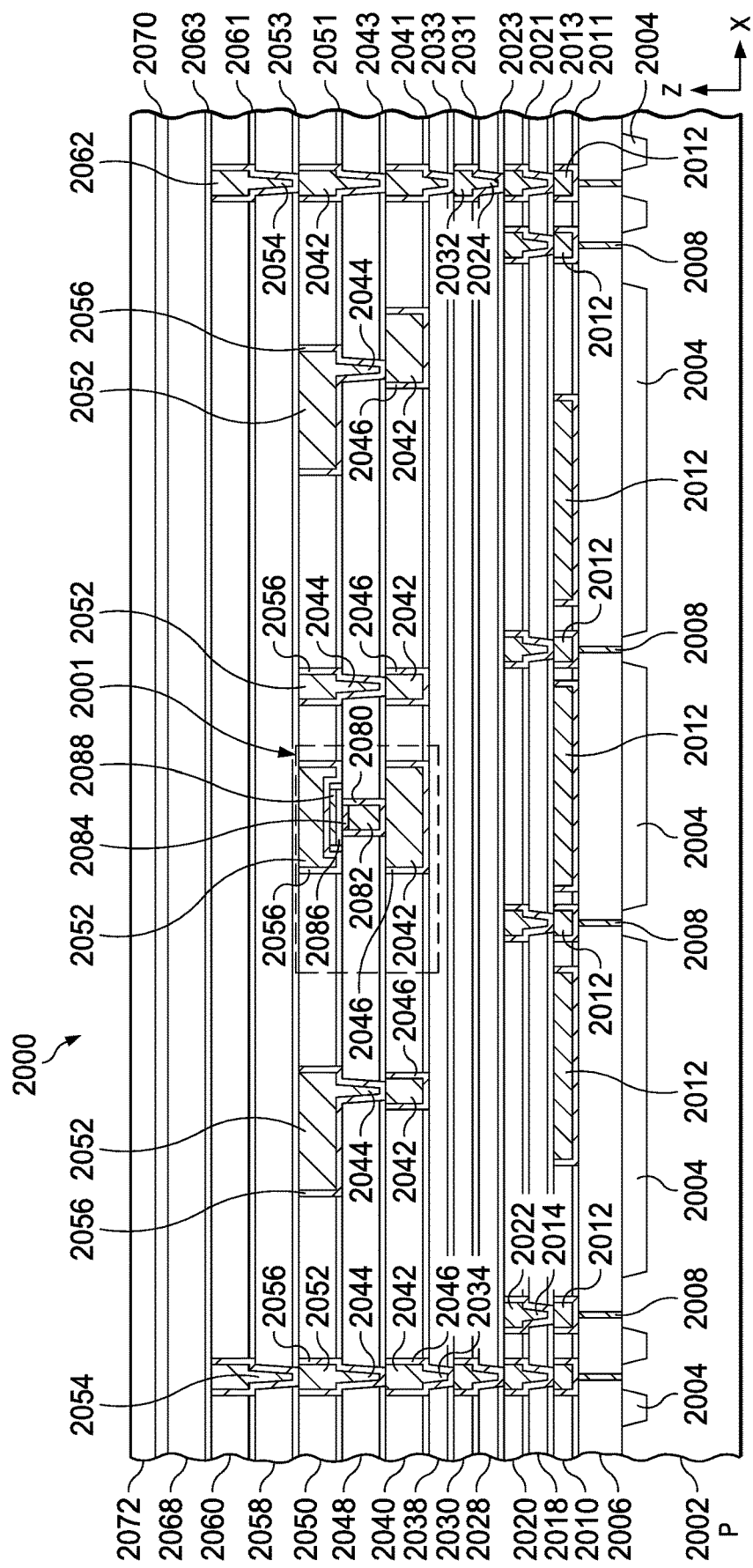
FIG. 20 is a partial sectional side elevation view of another integrated circuit with an integrated diode according to another embodiment.

Referring now to FIGS. 20 and 21, another example integrated circuit 2000 includes a MIM diode 2001 integrated into a copper-based multilevel metallization structure having dual damascene features. The IC 2000 includes a p-type semiconductor layer 2002 having isolation structures 2004 (e.g., shallow trench isolation or STI structures) formed on or in a top side of the semiconductor layer 2002, and a multilevel metallization structure disposed over the top side of the semiconductor layer 2002. The semiconductor layer in one example is a silicon layer, a silicon-germanium layer, a silicon-on-insulator (SOI) structure, or another layer having semiconductor material. The IC 2000 includes multiple electronic components, for example, transistors, resistors, capacitors (not shown) formed on and/or in the semiconductor layer 2002, as well as the MIM diode 2001 disposed in the multilevel metallization structure above the semiconductor layer 2002. The IC 2000 includes a first dielectric (e.g., PMD) layer 2006, such as silicon dioxide ($SiO_2$) or other suitable dielectric material. Conductive metal contacts 2008 (e.g., tungsten (W)) extend through the PMD layer 2006 to form electric connections with features of circuit components formed on and/or in the semiconductor layer 2002.

The multilevel metallization structure in this example is fabricated above the PMD layer 2006, and includes a number of levels, where the respective levels include first and second ILD layers with interleaved barrier layers (e.g., SiCN copper barrier layers) therebetween. An initial ILD layer 2010 is disposed above and associated barrier layer 2011 over the PMD layer 2006. In one example, the ILD 2010 is or includes silicon dioxide. One or more copper metal lines 2012 extend along select portions of a top side of the PMD layer 2006 to provide signal routing within the first level and electrical connection to select ones of the underlying contacts 2008. An intermediate barrier layer 2013 (e.g., SiCN) is formed over the lower ILD 2010 of the first level, and an upper ILD 2018 extends over the intermediate barrier layer 2013. Conductive copper metal vias 2014 extend from respective ones of the metal lines 2012 through the ILD 2013 between the associated metal line 2012 and the top side of the upper ILD 2018.

The multilevel metallization structure has an integer number of levels, where the individual levels include lower and upper ILD layers (e.g., silicon dioxide) respectively formed above lower and upper barrier layers (e.g., SiCN). The individual levels include metal lines extending through the corresponding lower ILD layer, as well as conductive metal vias extending through the corresponding upper ILD layer, where the metal line features are formed in dual damascene fashion in some or all of the levels concurrently with underlying vias of the preceding level.

The multilevel metallization structure has a next metallization structure level that includes a lower ILD layer 2020 disposed over a lower barrier layer 2021 above the top side of the preceding ILD 2018, along with respective copper metal lines 2022. The second level includes an intermediate barrier layer 2023 (e.g., SiCN) and an upper ILD 2028, with second level vias 2024. A further metallization structure level includes respective lower and upper ILD layers 2030 and 2038 respectively formed above lower and upper barrier layers 2031 and 2033, as well as metal lines 2032 that extend through the corresponding lower ILD layer 2030, and vias 2034 that extend through the upper ILD layer 2038.

In the example of FIGS. 20 and 21, the multilevel metallization structure includes another level, referred to herein as a first metallization structure level. In the illustrated example, the first ILD level is spaced from the PMD level by intervening metallization structure levels, although not a strict requirement of all possible implementations. The first metallization structure level includes a first lower ILD 2040 formed over a first lower barrier layer 2041, with a first metal layer 2046, 2042 that extend through the first lower ILD 2040. The first metallization structure level also includes a first upper barrier layer 2043 formed over a top side of the first lower ILD 2040, as well as a first upper ILD 2048 formed over the first lower ILD 2040. First vias 2044 extend through the first upper ILD 2048.

In one example, the metal lines of the various levels of the multilevel metallization structure, including the first metal layer, are multilayer structures, although not a requirement of all possible implementations. The example first metal layer has a metal titanium layer 2046 (Ti) that is or includes titanium, and a titanium nitride layer (TiN) that is or includes titanium nitride, to form a titanium/titanium nitride layer 2046. In addition, the first metal layer 2046, 2042 includes a thicker copper metal layer 2042 that is or includes copper. The copper metal layer 2042 and the underlying vias 2034 are formed within a titanium nitride or titanium/titanium nitride barrier layer 2046. The example first metallization structure level is disposed over the preceding metallization structure level (e.g., over the ILD 2038 and associated contacts 2034), and includes metal vias 2044 that extend through the first upper ILD 2048. Vias 2044 in one example are copper formed concurrently with the corresponding overlying metal lines of the second metallization structure level. In another implementation, the vias 2044 are or include a different conductive metal. The vias 2044 extend from a top portion of the associated first metal layer 2046, 2042 through a portion of the first lower dielectric layer 2040 to electrically connect the associated first metal layer 2046, 2042 with the second metallization structure layer.

The multilevel metallization structure of the IC 2000 also includes a second metallization structure level over the first metallization structure level. The second metallization structure level in this example includes a second lower ILD 2050 formed over a second lower barrier layer 2051. A second metal layer includes a barrier layer 2056 and a copper metal layer 2052 that extend through the second lower ILD 2050. The copper metal layer 2052 and the underlying first level vias 2044 are formed within a titanium nitride or titanium/titanium nitride barrier layer 2056. The second level includes an upper barrier layer 2053 and an upper ILD 2058, with copper vias 2054 extending through the second upper ILD 2058. The example second metal layer has a titanium/titanium nitride layer 2056 with a first sublayer that is or includes titanium, and a titanium nitride sublayer that is or includes titanium nitride. In addition, the second metal layer 2056, 2052 includes a thicker metal layer 2052 that is or includes copper formed in a dual damascene fashion with underlying vias 2044 of the first metallization structure layer. The second metallization structure level has metal vias 2054. A subsequent metallization structure level includes a lower ILD layer 2060 formed over a corresponding lower barrier layer 2061, with copper metal lines 2062, as well as an upper barrier layer 2063 and an upper ILD layer 2068. The IC 2000 in FIGS. 20 and 21 includes one or more capping layers 2070 and 2072 over a top side of the uppermost ILD 2060.

Referring to FIG. 21, The MIM diode 2001 is integrated into the first and second levels of the copper based multilevel metallization structure. In other implementations, the diode 2001 is integrated into any two adjacent levels of the multilevel metallization structure of the IC 2000. One terminal (e.g., bottom electrode) of the MIM diode 2001 is or includes a high work function metal (e.g., work function greater than 5), and the second diode terminal (e.g., upper electrode) is or includes a low work function metal (e.g., work function less than 5) connected to an associated first metal layer, in this example, a Ti/Tin layer 2046 and a connected copper metal line 2042 in the first lower ILD 2040. A diode terminal via has a titanium/titanium nitride (Ti/TiN) layer 2080 that extends on sidewalls and a bottom of a tungsten (W) via 2082. The tungsten via 2082 and the surrounding Ti/TiN layer 2080 form a metal via in the first metallization structure level. In other implementations where the diode 2001 is integrated into a first level of a multilevel metallization structure, the lower diode electrode or terminal is disposed on a metal contact (e.g., a PMD layer contact 2008).

The MIM diode 2001 includes a first electrode 2084 disposed on the metal via 2080, 2082. In one example, the first electrode 2084 is a metal layer having a work function greater than 5. In the example of FIG. 21, the metal via 2080, 2082 is or includes a tungsten layer 2082 disposed directly or indirectly on the first metal layer 2046, 2042. In the example of FIGS. 20 and 21, the tungsten via 2082 is disposed indirectly on the copper first metal layer 2042 through the Ti/TiN layer 2080. The first electrode 2084 is tungsten nitride (e.g., WyNx, such as $W_2N$), which has a higher work-function than tungsten and slower oxidation. In one example, the first electrode 2084 is directly on a top of the tungsten layer 2082. For example, the electrode 2084 is formed by nitridation of an upper surface of the tungsten via 2082 to form tungsten nitride. In other implementations, a different high work function metal is used, which can be formed by chemical processing or by separate deposition (e.g., FIGS. 36-40 below). In one example, the electrode 2084 is or includes platinum (e.g., Pt). In another example, the electrode 2084 is or includes iridium (e.g., Jr). In another example, the electrode 2084 is or includes rhodium (e.g., Rh). In another example, the electrode 2084 is or includes ruthenium (e.g., Ru). In one example, the via 2082, 2084 is or includes a low work function metal material. In another example, the via 2082, 2084 is or includes a high work function metal material, and the upper electrode is a low work function material. The provision of a high work function tungsten nitride as the lower electrode facilitates simplified fabrication by nitridation of a tungsten contact formed under the lower MIM diode electrode.

The MIM diode 2001 in FIGS. 20 and 21 includes a multilayer dielectric structure 2086 disposed on the first electrode 2084, and a low work function metal second electrode 2088 disposed on the multilayer dielectric structure 2086 in the second metallization structure level. In one example, the second metal layer 2056, 2052 is disposed on the second electrode 2088. The multilayer dielectric structure 2086 has N layers, where N is greater than 1. In one example, a first (e.g., bottom) layer and a last (e.g., uppermost) layer of the multilayer dielectric structure 2086 are any one or more of aluminum oxide (e.g., $Al_2O_3$), zirconium dioxide (e.g., $ZrO_2$), silicon dioxide (e.g., $SiO_2$), hafnium dioxide (e.g., $HfO_2$), or tantalum oxide (e.g., $Ta_2O_5$). In the example of FIGS. 20 and 21, the first and last layers of the multilayer dielectric structure 2086 are aluminum oxide (e.g., $Al_2O_3$). In one example, the multilayer dielectric structure 2086 has an odd number of dielectric layers (e.g., N is an odd integer greater than 2). In one implementation, the individual odd numbered layers of the multilayer dielectric structure 2086 are one of aluminum oxide, zirconium dioxide, silicon dioxide, hafnium dioxide, and tantalum oxide (e.g., $Ta_2O_5$), and the individual even numbered layers of the multilayer dielectric structure 2086 are one of titanium oxide (e.g., $TiO_2$) nickel oxide (e.g., NiO), cobalt oxide (e.g., $Co_2O_3$), tungsten oxide (e.g., $WO_3$), copper oxide (e.g., $Cu_2O$), and germanium oxide (e.g., $GeO_2$).

The second electrode 2088 is disposed on the multilayer dielectric structure 2086. In one example, the second metal layer 2056, 2052 includes titanium nitride portions 2056 and copper portions 2052 as described above, and the second electrode 2088 in FIGS. 20 and 21 is or includes a metal layer having a work function less than 5. In one example, the second electrode 2088 is or includes titanium (e.g., Ti). In another example, the second electrode 2088 is or includes scandium (e.g., Sc). In another example, the second electrode 2088 is or includes strontium (e.g., Sr). In another example, the second electrode 2088 is or includes lithium (e.g., Li). In another example, the second electrode 2088 is or includes potassium (e.g., K). In another example, the second electrode 2088 is or includes hafnium (e.g., Hf).

Figure 22:
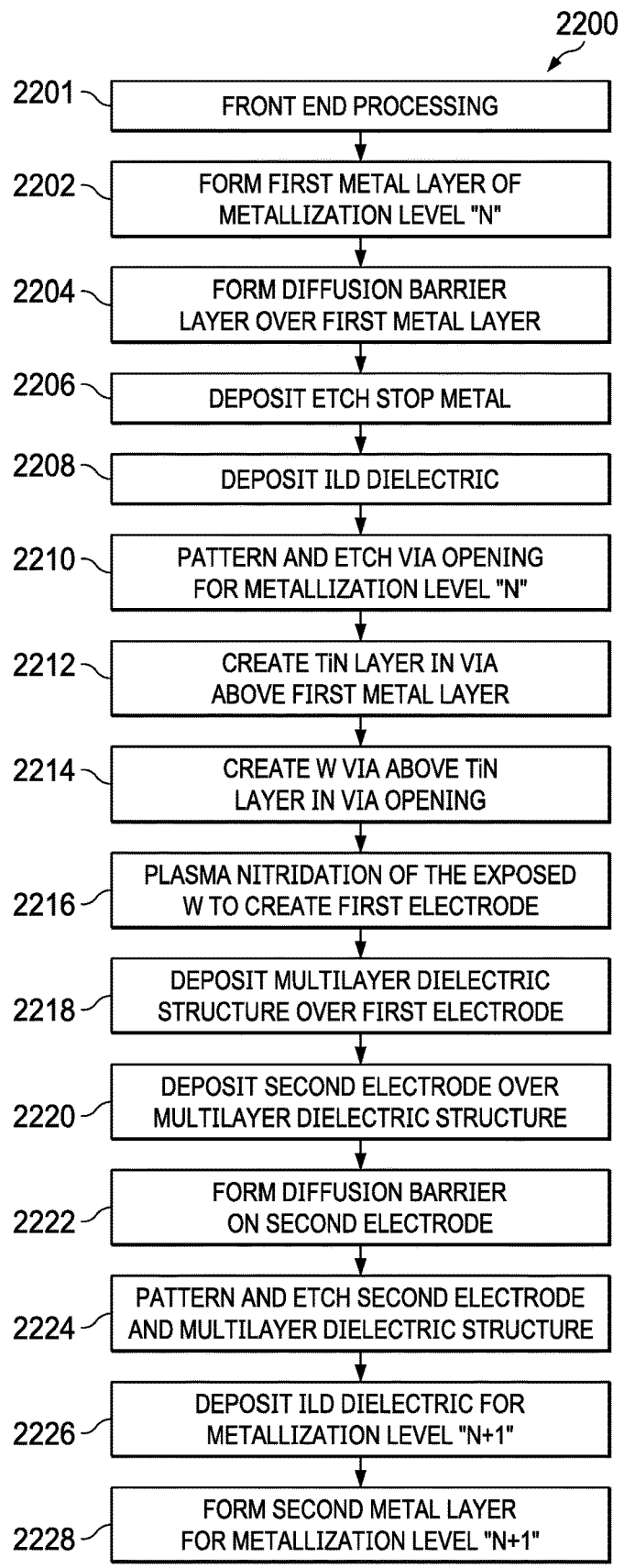
FIG. 22 is a flow diagram of a method of fabricating a metallization structure with an integrated diode according to another embodiment.

FIG. 22 shows a method 2200 of fabricating an integrated circuit including a multilevel copper-based metallization structure. FIGS. 23-36 show partial views of the diode 2001 in the IC 2000 of FIGS. 20 and 21 undergoing fabrication processing according to the method 2200. The method 2200 shows acts and events associated with construction of a multilevel metallization structure that incorporates the MIM diode 2001, and these steps may concurrently be used for fabricating interconnection of other electronic circuits and/or components (e.g., transistor circuits, etc., not shown) in a single IC 2000. The metallization structure in one example includes metal lines and vias that electrically couple terminals of the MIM diode 2001 to one or more internal components (not shown) of the IC 2000. Front end processing is performed at 2201 in FIG. 21, for example, fabricating one or more circuit components on and/or in a starting wafer. The fabrication further includes forming a pre-metal dielectric layer and associated contacts (e.g., tungsten) that are electrically coupled with one or more electronic circuit components of the IC 2000. Thereafter, a multilevel metallization structure is fabricated level by level. In the example of FIG. 20, the diode 2001 is constructed in first and second levels that respectively include interlayer dielectric layers 2040, 2040 and 2050.

Figure 23:
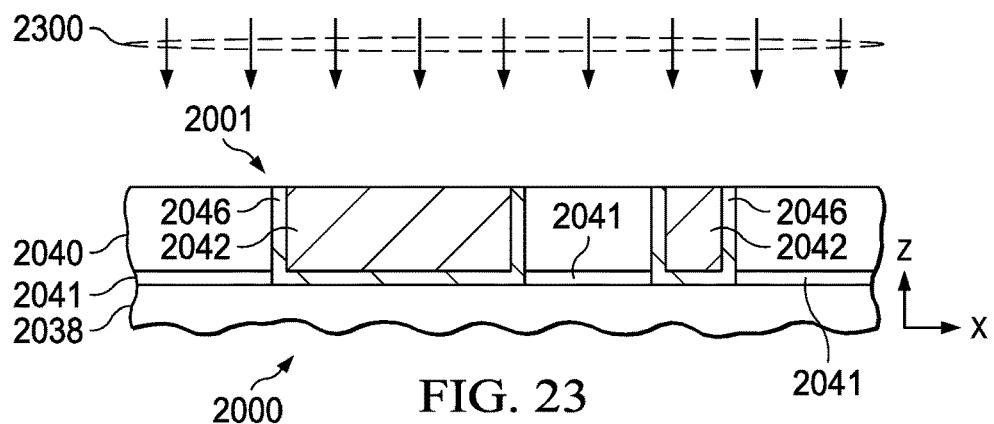
FIGS. 23-35 are partial sectional side elevation views of the integrated circuit of FIGS. 20 and 21 undergoing fabrication processing according to the method of FIG. 22.
Figure 24:
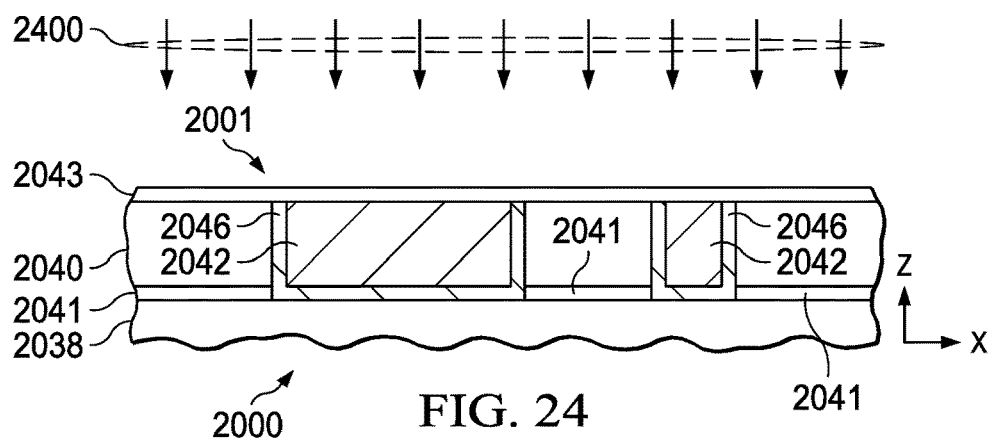

At 2202, a first metal layer of metallization level "N" is formed and patterned. FIG. 23 shows portions of a patterned first metal layer that has a titanium layer 2046. In another example, the layer 2046 includes a multilayer structure with a lower titanium sublayer formed on a top side of the upper ILD 2038 of the preceding metallization structure level, and an overlying titanium nitride sublayer. The first metal layer in FIG. 23 also includes a thicker copper metal layer 2042 that overlies the Ti or Ti/TiN layer 2046. The first metal layer 2046, 2042 is patterned to provide a feature 2046, 2042 that will be electrically connected to a bottom electrode of the subsequently formed diode 2001, as well as a portion of another feature partially shown in FIG. 23. A diffusion barrier layer is formed at 2204 over the first metal layer. FIG. 24 shows one example, in which a deposition process 2400 is performed that deposits a SiCN diffusion barrier layer 2043 over the ILD 2040 and the top of the first metal layer 2046, 2042. In one example, an etch stop layer (not shown) is deposited at 2206 in FIG. 22.

Figure 25:
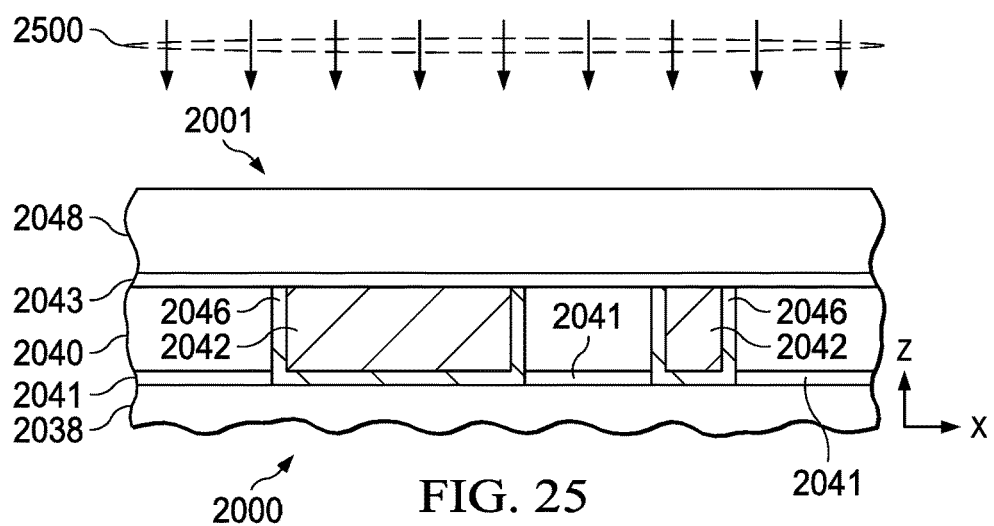
Figure 26:
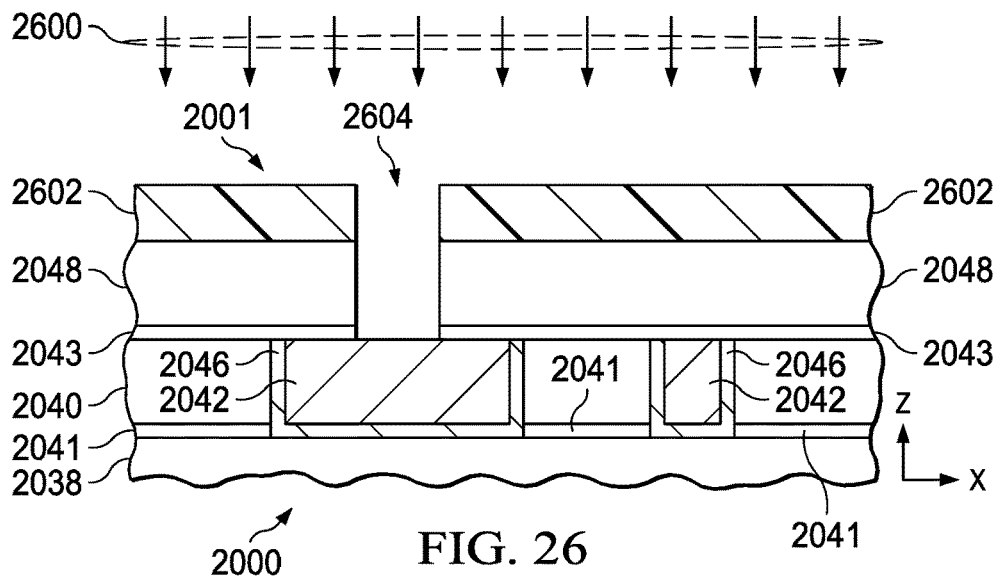

The method 2200 continues at 2208 with depositing the upper ILD dielectric for metallization structure level "N" (e.g., the first metallization level) and etching of the opening in the deposited ILD dielectric at 2210. FIG. 25 shows one example, in which a deposition process 2500 is performed that deposits the upper ILD 2048 of the first metallization structure layer over the barrier layer 2043. The deposited ILD is then patterned and etched at 2210 of FIG. 22. FIG. 26 shows one example, in which an etch process 2600 is performed using an etch mask 2602. The etch process 2600 etches a portion of the ILD layer 2048 to form an opening 2604. The opening 2604 exposes a portion of an upper side of the copper 2042 of the first metal layer.

Figure 27:
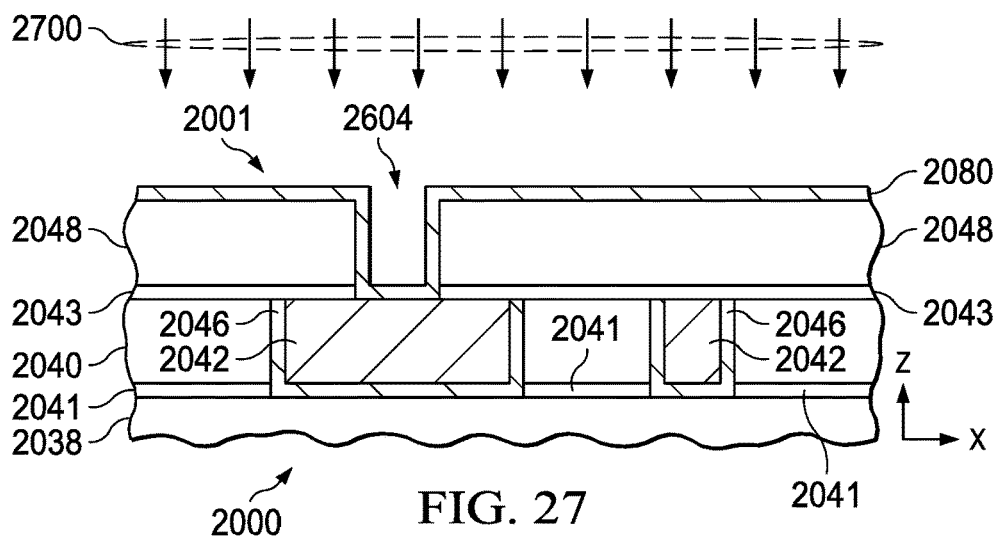
Figure 28:
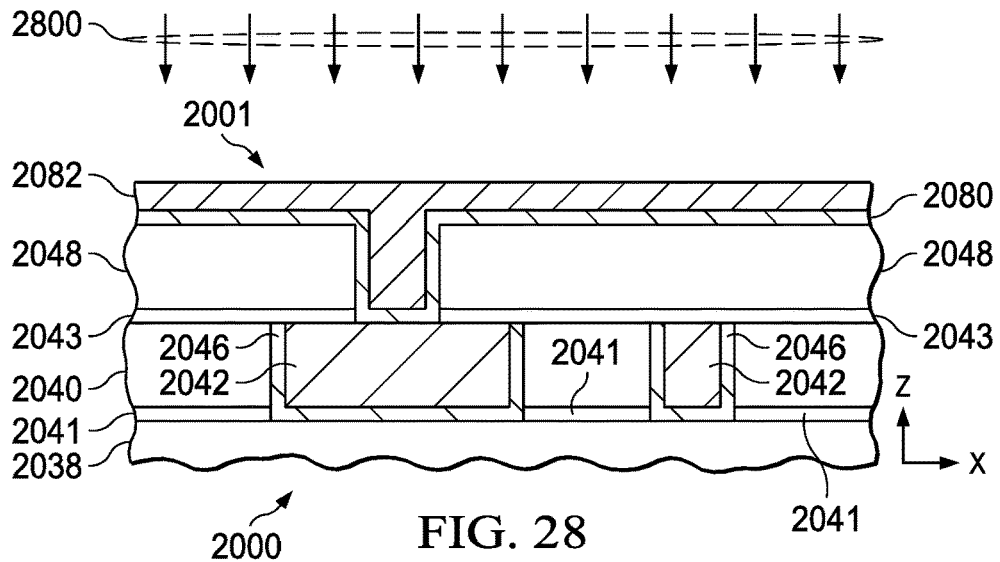

The method 2200 of FIG. 22 continues with formation of a via on the first metal layer at 2212 and 2214. A titanium nitride layer is formed at 2212 in the attached opening of the ILD. FIG. 27 shows one example, in which a deposition process 2700 is performed that deposits a titanium layer, or a titanium nitride layer, or a titanium/titanium nitride multilayer 2080 in the opening 2604. At 2214 in FIG. 22, a conductive metal via is formed above the layer 2080 in the opening. FIG. 28 shows one example, in which a deposition process 2800 is performed that deposits tungsten 2082 over the layer 2080 in the opening. The wafer is planarized, for example, using chemical mechanical polishing (CMP) processing (not shown) to remove excess portions of the layers 2080 and 2082 along the top side of the wafer, exposing the top side of the ILD 2048. The processing at 2210, 2212 and 2214 forms the metal contact 2080, 2082 on the first metal layer 2046, 2042 and through a portion of a first upper dielectric layer 2048 in the first metallization structure level.

Figure 29:
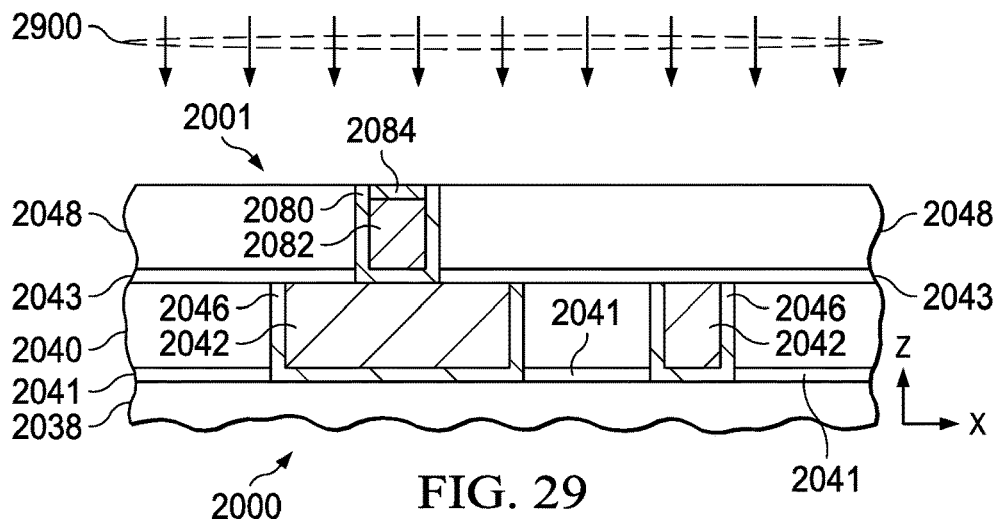

The method 2200 continues with formation of a MIM diode. The illustrated example provides an included method for integrating a MIM diode into a multilevel copper-based metallization structure of an IC. At 2216, a first electrode of the diode 2001 is a formed (e.g., a bottom electrode). FIG. 29 shows one example, in which a plasma nitridation process 2900 is performed. The nitridation process 2900 converts an upper portion of the deposited tungsten via 2082 into tungsten nitride to form the first electrode 2084 on the metal via 2080, 2082. The plasma nitridation process 2900 nitrides a portion of the metal contact or via 2080, 2082 to form the first electrode 2084 on the metal contact or via 2080, 2082. In one example, the nitridation process 2900 is a high energy plasma process using $N_2$ or $NH_3$ at 300-450 C with a bias voltage applied to the wafer to convert the surface layer of tungsten (W) to WyNx, which has a higher work function than tungsten and slower oxidation than tungsten. In one example, the plasma nitridation process 2900 is performed on tungsten at a temperature of 300-450 C (e.g., 400 C) to form the tungsten nitride first electrode 2084 having a thickness of approximately 2-5 nm.

Figure 30:
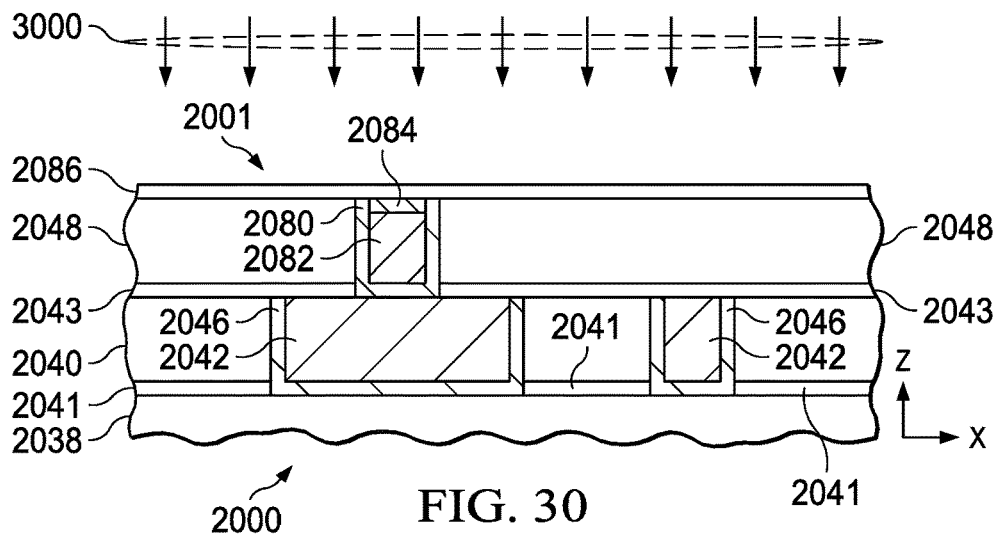

At 2218, the insulator portion of the MIM diode 2001 is formed as a multilayer dielectric structure on the first electrode 2084. FIG. 30 shows one example, in which a deposition process 3000 is performed that deposits the multilayer dielectric structure 2086 over the first electrode 2084. In one example, the deposition process 3000 is a series of multiple atomic layer deposition (ALD) processes that successively deposit an integer number N individual layers of the multilayer dielectric structure 2086, where N is greater than 2. In one example, the processing 3000 includes an odd number N ALD processes. In one example, the first ALD process deposits aluminum oxide (e.g., $Al_2O_3$) on the first electrode 2084, and a last or $N^{th}$ ALD processes deposits aluminum oxide (e.g., $Al_2O_3$) on dielectric layer N−1. In another example the first (e.g., bottom) layer and the last (e.g., uppermost) layer of the multilayer dielectric structure 2086 are any one or more of aluminum oxide (e.g., $Al_2O_3$), zirconium dioxide (e.g., $ZrO_2$), silicon dioxide (e.g., $SiO_2$), hafnium dioxide (e.g., $HfO_2$), tantalum oxide (e.g., $Ta_2O_5$), or titanium oxide (e.g., $TiO_2$).

In one example, the multi-pass ALD processing 3000 deposits an odd number N dielectric layers, in which individual odd numbered ALD steps form corresponding odd numbered layers of the multilayer dielectric structure 2086 by depositing one of aluminum oxide, zirconium dioxide, silicon dioxide, hafnium dioxide, and tantalum oxide (e.g., $Ta_2O_5$). In certain examples, the atomic layer deposition of the high bandgap material oxygen stable layer on WN or W is performed using reactants such as ($H_2O$+($N_2O$ and/or NO and/or $NH_3$ and/or $H_2$ and/or CO)) or (($N_2O$ and/or NO)) with initial exposure of ($NH_3$ and/or $H_2$ and/or CO). The individual even numbered ALD steps in this example form corresponding even numbered layers of the multilayer dielectric structure 2086 by depositing a low bandgap material, such as one of titanium oxide (e.g., $TiO_2$) nickel oxide (e.g., NiO), cobalt oxide (e.g., $Co_2O_3$), tungsten oxide (e.g., $WO_3$), copper oxide (e.g., $Cu_2O$), and germanium oxide (e.g., $GeO_2$).

In one example, all the layers of the multilayer dielectric structure 2086 are thin to facilitate operation as a tunnel dielectric of the MIM diode 2001. In addition, the first and last layers of the multilayer dielectric structure 2086 are preferably made of an oxygen stable material, such as aluminum oxide. Other suitable materials for the first and last layers of the multilayer dielectric structure 2086 include $ZrO_2$, $SiO_2$, $HfO_2$, $Ta_2O_5$, and $TiO_2$. Aluminum oxide implementations may include oxidizing aluminum from a deposited precursor like $AlCl_2$ or tri-methyl Al. Other suitable materials for the first layer of the multilayer dielectric structure 2086 include dielectric nitrides, such as silicon nitride or aluminum nitride (e.g., SiN or AN). Additional dielectric materials in the multilayer dielectric structure 2086 can include lowered bandgap materials, such as NiO, $Co_2O_3$, $WO_3$, $Cu_2O$, $GeO_2$, and/or $TiO_2$. In certain examples, the adjacent layers of the multilayer dielectric structure 2086 alternate between two different dielectrics. One suitable implementation has an odd number of layers. One example 5-layer dielectric structure 2086 includes successive layers having $AlO/Cu_2O/AlO/Cu_2O/AlO$. Another example 5-layer dielectric structure 2086 includes successive layers having $SiO_2/TiO_2/SiO_2/TiO_2/SiO_2$. Another example 5-layer dielectric structure 2086 includes successive layers having $Al_2O_3/Cu_2O/Al_2O_3/Cu_2O/Al_2O_3$.

In one example, the initial dielectric layer formed on a tungsten contact or via (e.g., via 2082) is deposited in a mildly oxidative environment. In one example, the multilayer dielectric structure 2086 is fabricated using atomic layer deposition of AlO, $SiO_2$ in $H_2O$ at a low temperature. In another example, the multilayer dielectric structure 2086 is fabricated using atomic layer deposition of AlO or other high oxygen stability layer with a mild oxidizer such as $H_2O$, $CO_2$, $N_2O$, NO, including initial growth with a small concentration of reducers like CO, $H_2$ or even $NH_3$ in one example.

For examples using a tungsten via 2082 and a tungsten nitride lower electrode 2084, the atomic layer deposition of the first layer of the multilayer dielectric structure 2086 in one example does not use $O_3$. In one example, this initial ALD deposition is a low temperature deposition process with $H_2O$. Although WN oxidizes with $H_2O$ but controlled low temperature atomic layer deposition is used to mitigate tungsten nitride oxidation in one example, for example, with a mild oxidizer. Example mild oxidizers include $H_2O$, $CO_2$, $N_2O$, and NO. In one example, the initial atomic layer deposition is performed with a small concentration of reducers, such as $NH_3$, $H_2$ or CO. Higher bandgap tunnel dielectric layers of the multilayer dielectric structure 2086 are preferably formed as thinner layers in one example. In one implementation, following protection of the tungsten nitride electrode 2084 with an initial AlOx or other suitable first layer, subsequent layers of the multilayer dielectric structure 2086 are deposited using higher temperature and/or stronger oxidizers, such as $O_3$ or $H_2O+O_2$ or plasma $O_2$. In particular, many low bandgap dielectric layers like NiO, $Cu_2O$ benefit from deposition using strong oxidizers. Low bandgap oxides that use materials already found in many wafer fabrication facilities include $TiO_2$, NiO, $Co_2O_3$, $WO_3$, $Cu_2O$, $GeO_2$. In certain examples, the dielectric material and composition can be tailored or optimized with electrode materials to maximize diode asymmetry to facilitate diode performance at high frequencies such as THz.

Figure 31:
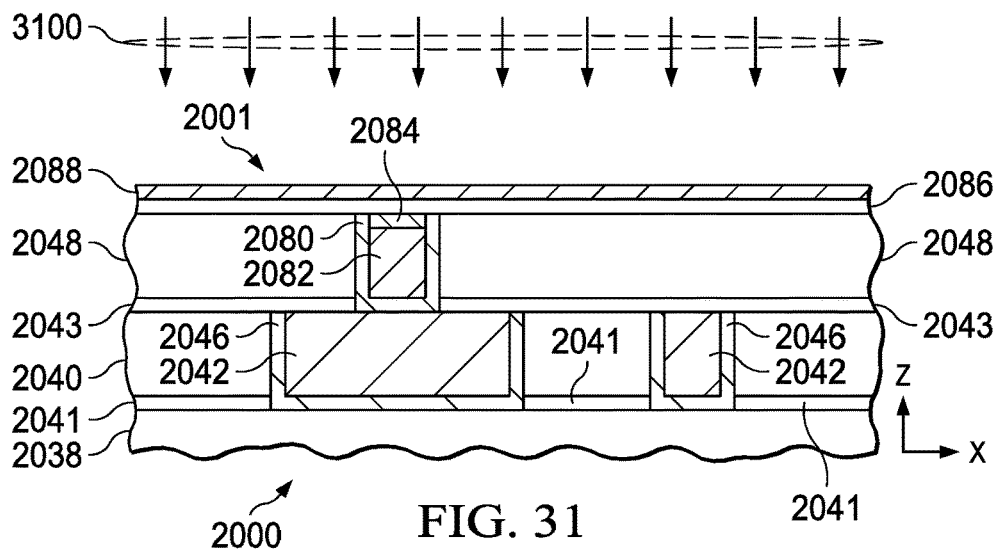
Figure 32:
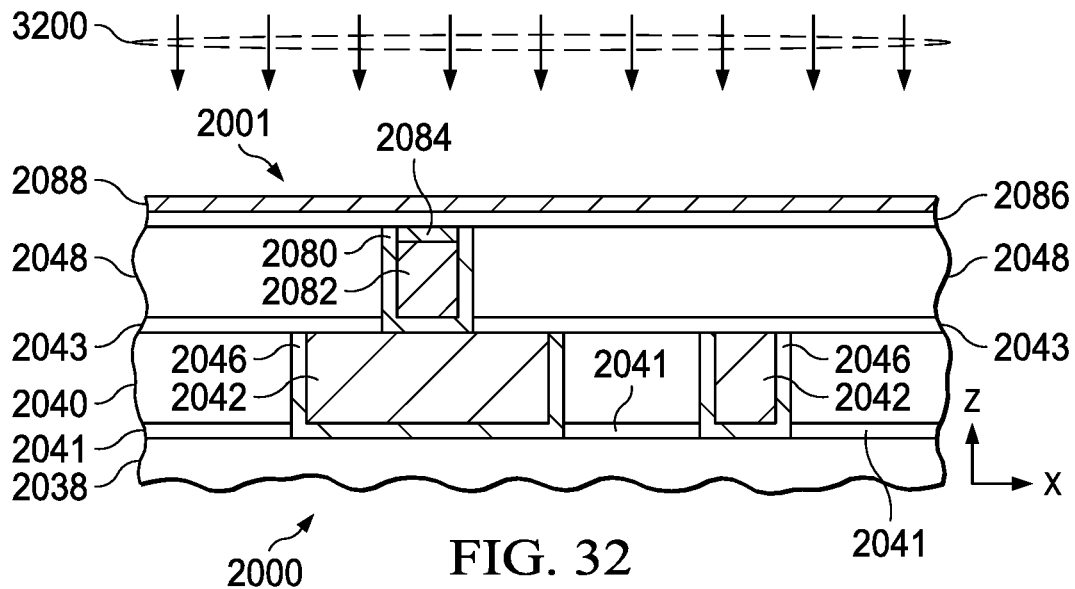

At 2220, the method 2200 continues with forming a second electrode on the multilayer dielectric structure. FIG. 31 shows one example, in which a plasma vapor deposition (PVD) process 3100 is performed that deposits the second electrode layer 2088 on the uppermost layer of the multilayer dielectric structure 2086. In one example, the upper or second electrode 2088 is a low work function metal, for example, having a work function less than 5, such as titanium form to a thickness of approximately 20 nm. In one example, the deposition process 900 forms the second electrode 2088 by depositing titanium, or titanium nitride, or depositing titanium followed by deposition of titanium nitride. In another example, the deposition process 900 forms the second electrode 2088 by depositing scandium. In another example, the deposition process 900 forms the second electrode 2088 by depositing strontium. In another example, the deposition process 900 forms the second electrode 2088 by depositing lithium. In another example, the deposition process 900 forms the second electrode 2088 by depositing potassium. In another example, the deposition process 900 forms the second electrode 2088 by depositing hafnium. In one example, the low work function second electrode layer 2088 is capped with a diffusion barrier layer at 2222 in FIG. 22. FIG. 32 shows one example, in which a deposition process 3200 is performed that deposits a diffusion layer (not shown) on the second electrode 2088.

Figure 33:
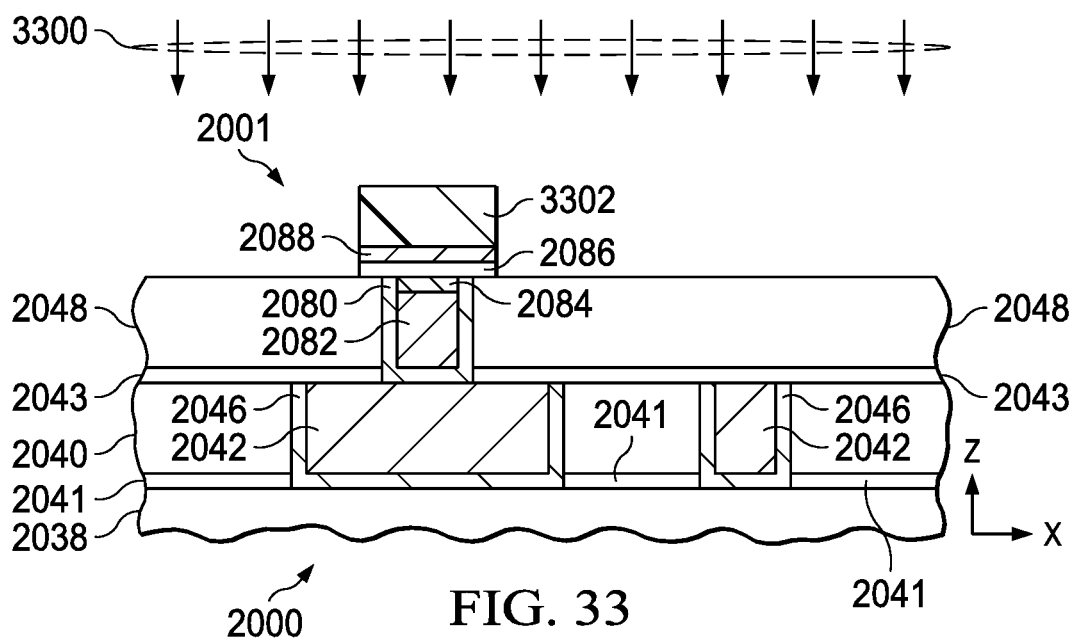

At 2224 in FIG. 22, the second electrode and multilayer dielectric structure are patterned and etched. FIG. 33 shows one example, in which an etch process 3300 is performed using an etch mask 3302. The etch process 3300 removes exposed portions of the second electrode layer 2088 (and any included diffusion barrier layer, not shown), as well as subsequently exposed portions of the multilayer dielectric structure 2086. In one example, the etch process 3300 has multiple etch steps to selectively remove the layers 2088 and 2086, using a single mask 3302 or multiple masks.

Figure 34:
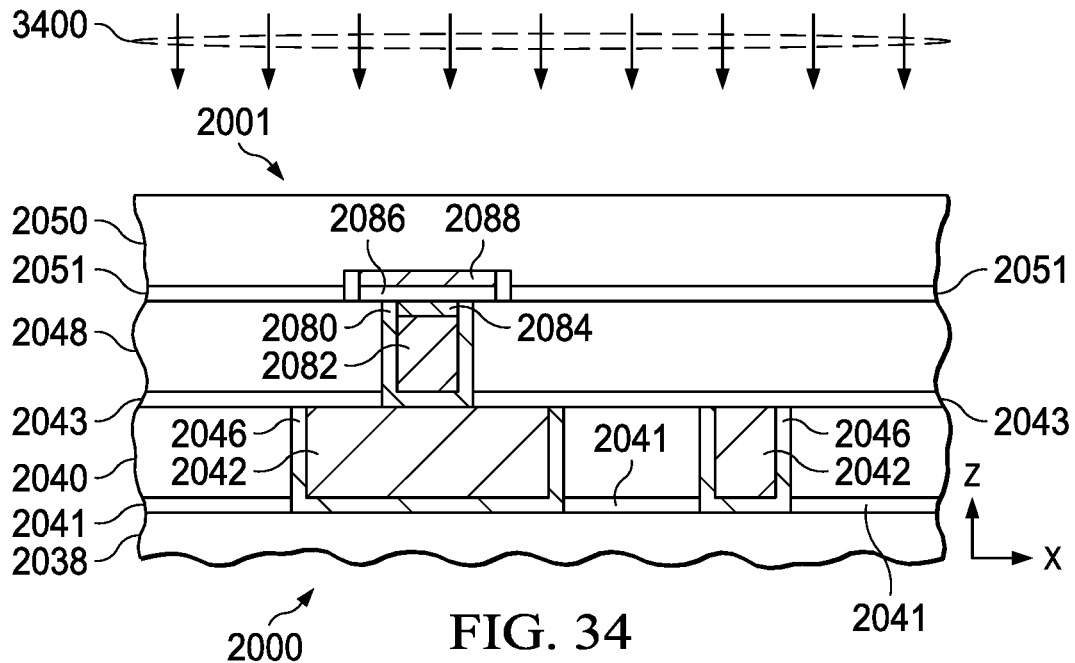
Figure 35:
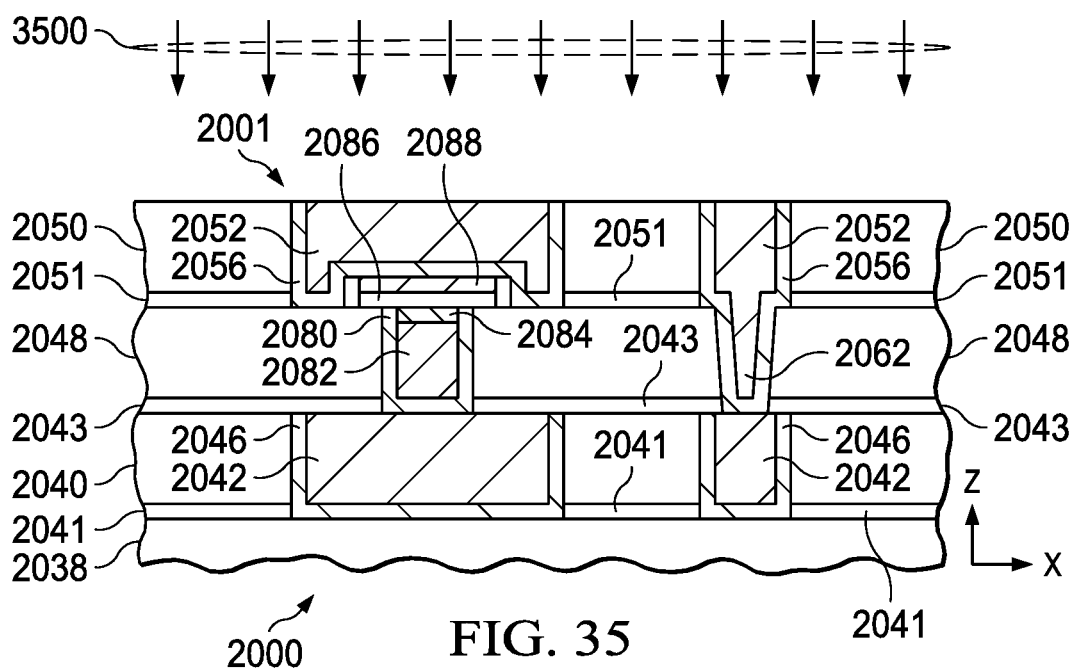

The method 2200 in FIG. 22 continues at 2226 with formation of the lower ILD 2050 of the second metallization structure level. The barrier layer 2051 is deposited, followed by deposition of the lower ILD 2050. FIG. 34 shows one example, in which a deposition process 3400 is performed that deposits the lower ILD 2050 of the second metallization structure level. The method 2200 in FIG. 22 continues at 2228 to form metal lines of the next (e.g., second) metallization structure level. The processing at 2228 in FIG. 22 forms the second metal layer 2056, 2052 in the second metallization structure level in the IC 2000 of FIGS. 20 and 21 to electrically couple the second metallization structure level to the second electrode 2086. FIG. 35 shows one example, in which processing 3500 is performed that etches openings in the lower ILD 2050, deposits a titanium layer, or a titanium nitride layer, or a titanium/titanium nitride multilayer 2056 in the openings over the second electrode 2088, and copper is formed over the titanium/titanium nitride multilayer 2051, for example, by a plasma vapor deposition of a copper seed layer, followed by copper electroplating or other suitable deposition processing. The processed wafer is then planarized, for example using chemical mechanical polishing (not shown). Thereafter, the IC fabrication process continues with deposition of the next ILD layer (e.g., layer 2058 and associated barrier layer 2053 in FIGS. 20 and 21), followed by completion of the multilevel metallization structure, wafer probe testing, die singulation, packaging, and final testing (not shown).

Figure 36:
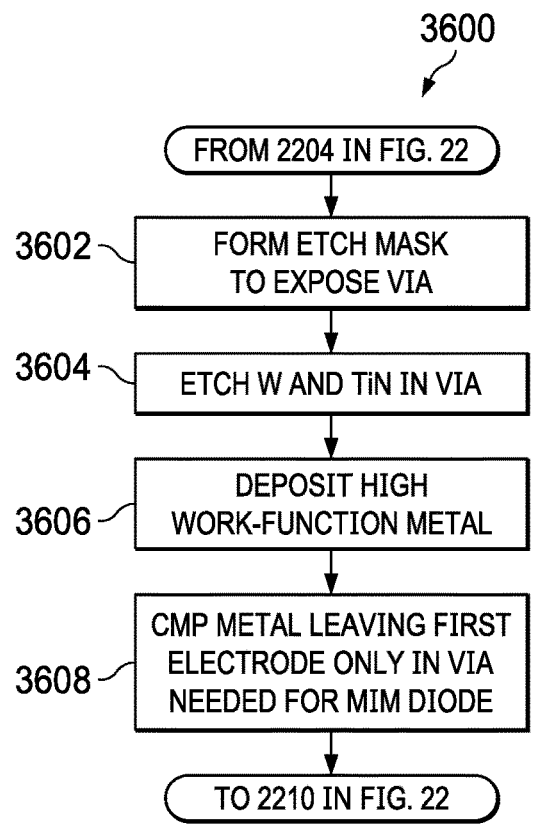
FIG. 36 is a flow diagram of an alternate process to form the first electrode in the integrated circuit of FIGS. 20 and 21.
Figure 37:
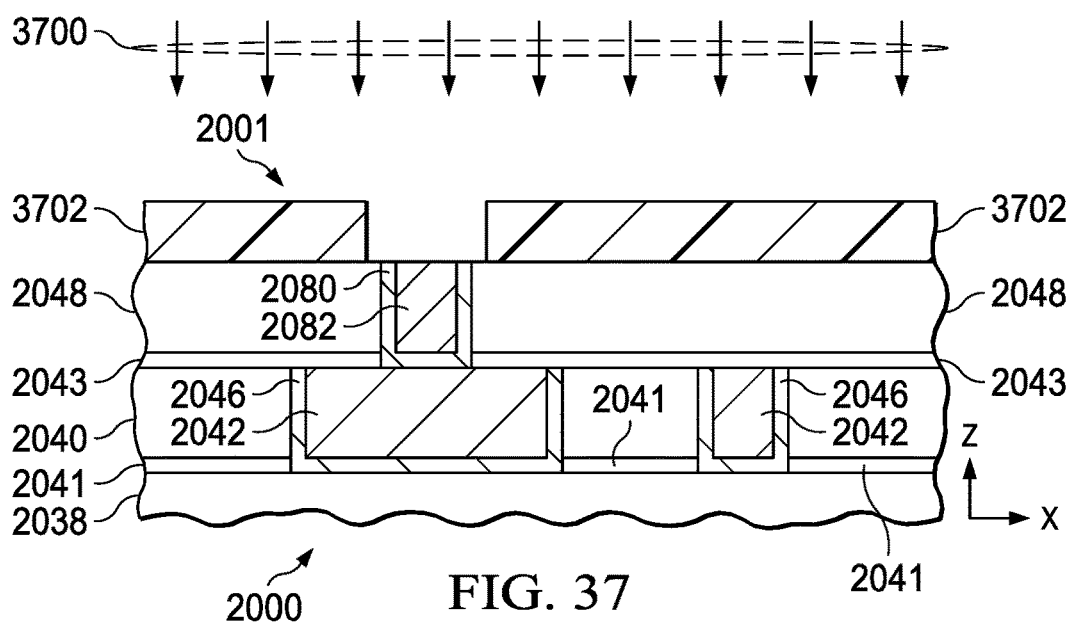
FIGS. 37-40 are partial sectional side elevation views of the integrated circuit of FIGS. 20 and 21 undergoing fabrication processing according to the alternate process of FIG. 36.
Figure 38:
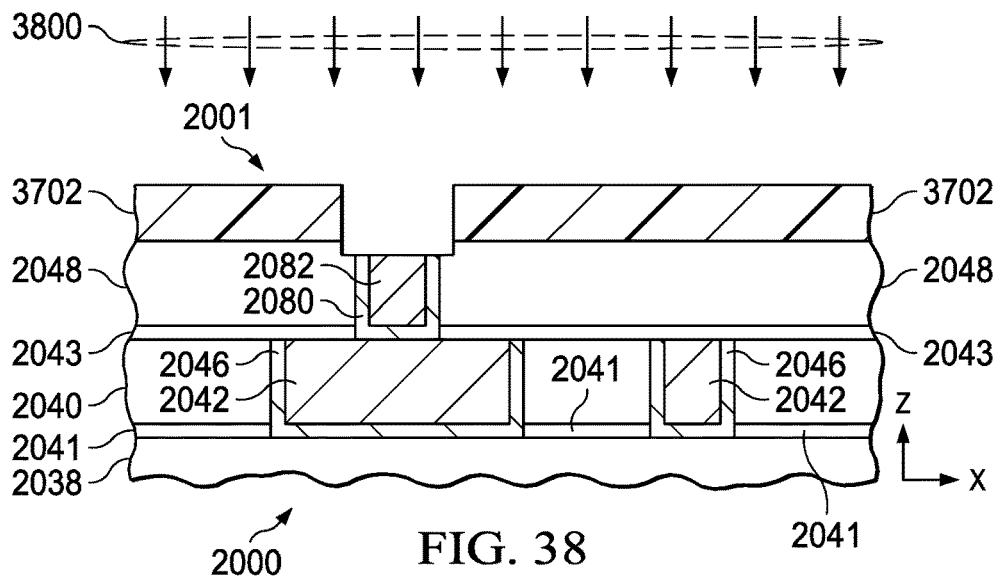
Figure 39:
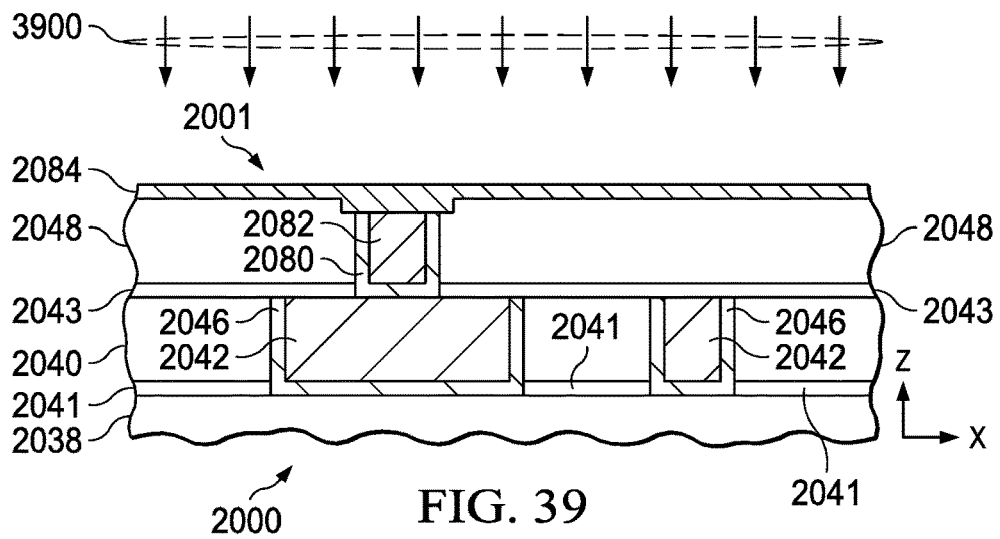
Figure 40:
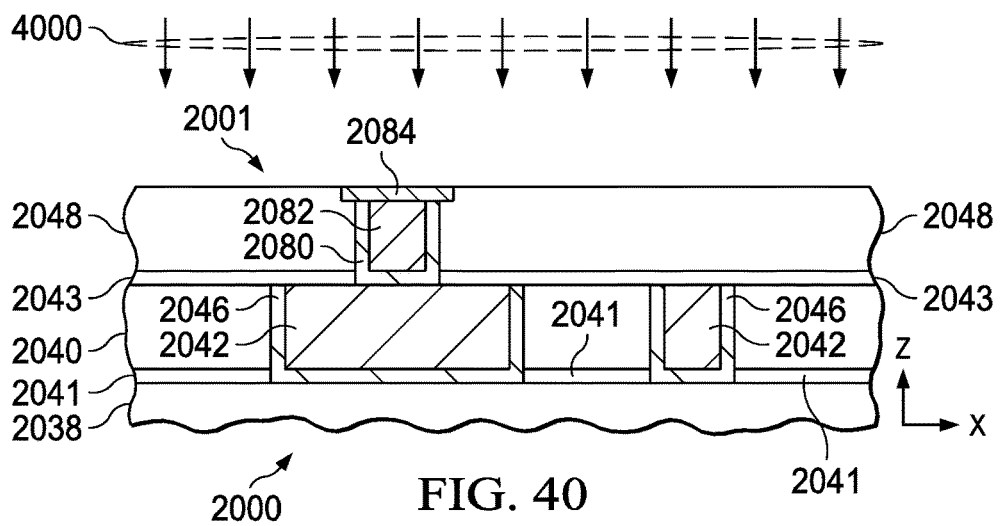

FIGS. 36-40 show alternate processing to form the first electrode of the MIM diode 2001 by deposition instead of nitridation. FIG. 36 shows an alternate process 3600 to form the first electrode 2084 through deposition processing in the integrated circuit of FIGS. 20 and 21, and FIGS. 37-40 show the diode 2001 undergoing fabrication processing according to the alternate process 3600. The process 3600 deposits a high work function metal to form the first electrode 2084 of the MIM diode 2001. In one example, the process 3600 starts after the via creation at 2204 in FIG. 22 above and includes forming an etch mask to expose the via at 3602. FIG. 37 shows one example, in which a process 3700 forms an etch mask 3702 with an opening that exposes a portion of the tungsten via 2082 and a portion of the titanium/titanium nitride layer 2080. At 3604 in FIG. 36, the via 2082 is etched along with the exposed portion of the titanium/titanium nitride 2080. FIG. 38 shows one example, in which an etch process 3800 is performed using the etch mask 3702. The etch process 3800 in this example etches an upper portion of the exposed tungsten via 2082 and the titanium/titanium nitride layer 2080. At 3606 in FIG. 36, the alternate electrode formation process 3600 includes depositing a high work function metal. FIG. 39 shows one example, in which a deposition process 3900 deposits a high work function metal 2084 above the tungsten via 2082 and the titanium/titanium nitride layer 2080. In one example, the process 3900 deposits platinum 2084. In another example, the process 3900 deposits iridium 2084. In another example, the process 3900 deposits rhodium 2084. The processed wafer is done planarized at 3608 using chemical mechanical polishing to leave the first electrode 2084 over the via 2082 and finish the alternate electrode fabrication processing 3600. FIG. 40 shows one example, in which a CMP process 4000 is performed that planarizes the top side of the wafer. The integrated circuit fabrication then continues at 2210 in FIG. 22 as described above.

Modifications are possible in the described examples, and other implementations are possible, within the scope of the claims.

What is claimed is:

1. An integrated circuit (IC), comprising:
   a semiconductor layer;
   a multilevel metallization structure over the semiconductor layer;
   a first metallization structure level in the multilevel metallization structure, the first metallization structure level having: a first metal layer; a first dielectric layer over the first metal layer; and a metal contact or via on the first metal layer and extending through a portion of the first dielectric layer;
   a second metallization structure level in the multilevel metallization structure, the second metallization structure level having: a second metal layer; and a second dielectric layer over the second metal layer; and
   a diode, having: a first electrode on the metal contact or via, in which the first electrode is a metal layer having a work function greater than 5 eV; a multilayer dielectric structure on the first electrode; and a second electrode on the multilayer dielectric structure, the second metal layer on the second electrode.

2. The IC of claim 1, wherein a first layer and a last layer of the multilayer dielectric structure are one of aluminum oxide, zirconium dioxide, silicon dioxide, hafnium dioxide, or tantalum oxide.

3. The IC of claim 2, wherein:
   the multilayer dielectric structure has an odd number N layers, N being greater than 2;
   odd numbered layers of the multilayer dielectric structure are one of aluminum oxide, zirconium dioxide, silicon dioxide, hafnium dioxide, or tantalum oxide; and
   even numbered layers of the multilayer dielectric structure are one of titanium oxide, nickel oxide, cobalt oxide, tungsten oxide, copper oxide, or germanium oxide.

4. The IC of claim 2, wherein:
   the metal contact or via is a tungsten layer on the first metal layer; and
   the first electrode is tungsten nitride.

5. The IC of claim 4, wherein:
   the multilayer dielectric structure has an odd number N layers, N being greater than 2;

odd numbered layers of the multilayer dielectric structure are one of aluminum oxide, zirconium dioxide, silicon dioxide, hafnium dioxide, or tantalum oxide; and even numbered layers of the multilayer dielectric structure are one of titanium oxide, nickel oxide, cobalt oxide, tungsten oxide, copper oxide, or germanium oxide.

6. The IC of claim 5, wherein the second electrode is a metal layer having a work function less than 5 eV.

7. The IC of claim 1, wherein the second electrode is a metal layer having a work function less than 5 eV.

8. The IC of claim 1, wherein:
the metal contact or via is a tungsten layer on the first metal layer; and
the first electrode is tungsten nitride.

9. The IC of claim 1, wherein the first metal layer and the second metal layer are aluminum.

10. The IC of claim 1, wherein the first metal layer and the second metal layer are copper.

11. An integrated circuit (IC), comprising:
a semiconductor layer;
a multilevel metallization structure over the semiconductor layer;
a first metallization structure level in the multilevel metallization structure, the first metallization structure level having: a first metal layer; a first dielectric layer over the first metal layer; and a metal contact or via on the first metal layer and extending through a portion of the first dielectric layer, in which the metal contact or via is a tungsten layer on the first metal layer;
a second metallization structure level in the multilevel metallization structure, the second metallization structure level having: a second metal layer; and a second dielectric layer over the second metal layer; and
a diode, having: a first electrode on the metal contact or via, in which the first electrode is tungsten nitride; a multilayer dielectric structure on the first electrode, in which a first layer and a last layer of the multilayer dielectric structure are aluminum oxide; and a second electrode on the multilayer dielectric structure, the second metal layer on the second electrode.

12. A diode, comprising:
a first electrode on a metal contact or via in a first metallization structure level of a multilevel metallization structure, in which the first electrode is a metal layer having a work function greater than 5 eV;
a multilayer dielectric structure on the first electrode; and
a second electrode having a first side and an opposite second side, the first side on the multilayer dielectric structure, and the second side below a second metal layer in a second metallization structure level of the multilevel metallization structure.

13. The diode of claim 12, wherein a first layer and a last layer of the multilayer dielectric structure are one of aluminum oxide, zirconium dioxide, silicon dioxide, hafnium dioxide, or tantalum oxide.

14. The diode of claim 12, wherein the metal contact or via is a tungsten layer, and the first electrode is tungsten nitride.

15. A diode comprising:
a first electrode on a metal contact or via in a first metallization structure level of a multilevel metallization structure;
a multilayer dielectric structure on the first electrode, in which: a first layer and a last layer of the multilayer dielectric structure are one of aluminum oxide, zirconium dioxide, silicon dioxide, hafnium dioxide, or tantalum oxide; the multilayer dielectric structure has an odd number N layers, N being greater than 2; odd numbered layers of the multilayer dielectric structure are one of aluminum oxide, zirconium dioxide, silicon dioxide, hafnium dioxide, or tantalum oxide; and even numbered layers of the multilayer dielectric structure are one of titanium oxide, nickel oxide, cobalt oxide, tungsten oxide, copper oxide, or germanium oxide; and
a second electrode having a first side and an opposite second side, the first side on the multilayer dielectric structure, and the second side below a second metal layer in a second metallization structure level of the multilevel metallization structure.

16. A method of fabricating a multilevel metallization structure of an integrated circuit, the method comprising:
forming a metal contact or via on a first metal layer and through a portion of a first dielectric layer in a first metallization structure level in a multilevel metallization structure;
forming a first electrode on the metal contact or via, including performing a plasma nitridation process that nitrides a portion of the metal contact or via to form the first electrode on the metal contact or via;
forming a multilayer dielectric structure on the first electrode;
forming a second electrode on the multilayer dielectric structure; and
forming a second metal layer in a second metallization structure level in the multilevel metallization structure.

17. A method of fabricating a multilevel metallization structure of an integrated circuit, the method comprising:
forming a metal contact or via on a first metal layer and through a portion of a first dielectric layer in a first metallization structure level in a multilevel metallization structure;
forming a first electrode on the metal contact or via;
forming a multilayer dielectric structure on the first electrode, including performing an odd integer number N atomic layer deposition processes that successively deposit N respective dielectric layers over the first electrode;
forming a second electrode on the multilayer dielectric structure; and
forming a second metal layer in a second metallization structure level in the multilevel metallization structure.

18. The method of claim 17, wherein a first one of the atomic layer deposition processes is performed in an oxidative environment.

* * * * *